(12) United States Patent
Matovu et al.

(10) Patent No.: US 11,088,017 B2
(45) Date of Patent: Aug. 10, 2021

(54) STAIR STEP STRUCTURES INCLUDING INSULATIVE MATERIALS, AND RELATED DEVICES

(71) Applicant: Micron Technology, Inc., Boise, ID (US)

(72) Inventors: John B. Matovu, Boise, ID (US); David S. Meyaard, Boise, ID (US); Gowrisankar Damarla, Lehi, UT (US); Sri Sai Sivakumar Vegunta, Boise, ID (US); Kunal Shrotri, Boise, ID (US); Shashank Saraf, Boise, ID (US); Kevin R. Gast, Boise, ID (US); Jivaan Kishore Jhothiraman, Meridian, ID (US); Suresh Ramarajan, Boise, ID (US); Lifang Xu, Boise, ID (US); Rithu K. Bhonsle, Boise, ID (US); Rutuparna Narulkar, Boise, ID (US); Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/806,312

(22) Filed: Mar. 2, 2020

(65) Prior Publication Data

US 2020/0203220 A1 Jun. 25, 2020

Related U.S. Application Data

(63) Continuation of application No. 16/172,218, filed on Oct. 26, 2018, now Pat. No. 10,600,682, which is a
(Continued)

(51) Int. Cl.
*H01L 21/768* (2006.01)
*H01L 23/522* (2006.01)
(Continued)

(52) U.S. Cl.
CPC .. *H01L 21/76816* (2013.01); *H01L 21/31051* (2013.01); *H01L 21/76811* (2013.01);
(Continued)

(58) Field of Classification Search
CPC ......... H01L 21/76816; H01L 21/76877; H01L 21/76832; H01L 27/11556;
(Continued)

(56) References Cited

U.S. PATENT DOCUMENTS 8,217,439 B2 7/2012 Kennedy
8,395,190 B2 3/2013 Shim et al.
(Continued)

*Primary Examiner* — Khiem D Nguyen
(74) *Attorney, Agent, or Firm* — TraskBritt

(57) ABSTRACT

A method of forming a semiconductor structure includes forming a sacrificial material over a stack comprising alternating levels of a dielectric material and another material, forming an opening through the sacrificial material and at least some of the alternating levels of the dielectric material and the another material, forming at least one oxide material in the opening and overlying surfaces of the sacrificial material, an uppermost surface of the at least one oxide material extending more distal from a surface of a substrate than an uppermost level of the dielectric material and the another material, planarizing at least a portion of the at least one oxide material to expose a portion of the sacrificial material, and removing the sacrificial material while the uppermost surface of the at least one oxide material remains more distal from the surface of the substrate than the uppermost level of the alternating levels of the dielectric material and the another material. Related methods of forming semiconductor structures and related semiconductor devices are disclosed.

17 Claims, 18 Drawing Sheets

Related U.S. Application Data continuation of application No. 15/857,197, filed on Dec. 28, 2017, now Pat. No. 10,269,625.

(51) Int. Cl.
- *H01L 23/528* (2006.01)
- *H01L 21/3105* (2006.01)
- *H01L 27/11582* (2017.01)
- *H01L 27/11556* (2017.01)
- *H01L 27/11575* (2017.01)
- *H01L 27/11548* (2017.01)

(52) U.S. Cl.
CPC .. *H01L 21/76819* (2013.01); *H01L 21/76832* (2013.01); *H01L 21/76877* (2013.01); *H01L 23/5226* (2013.01); *H01L 23/5283* (2013.01); *H01L 27/11548* (2013.01); *H01L 27/11556* (2013.01); *H01L 27/11575* (2013.01); *H01L 27/11582* (2013.01)

(58) Field of Classification Search
CPC ......... H01L 27/11582; H01L 27/11575; H01L 27/11548; H01L 21/31051; H01L 21/76819; H01L 21/31053; H01L 27/11524; H01L 27/11529; H01L 27/1157; H01L 27/11573; H01L 23/5226; H01L 21/76811

See application file for complete search history.

(56) References Cited

U.S. PATENT DOCUMENTS

| | | | |
|---|---|---|---|
| 8,405,142 B2 | 3/2013 | Katsumata et al. | |
| 8,765,598 B2 | 7/2014 | Smith et al. | |
| 9,165,937 B2 | 10/2015 | Yip et al. | |
| 9,356,038 B2 * | 5/2016 | Lee | H01L 27/11548 |
| 9,368,509 B2 | 6/2016 | Pang et al. | |
| 9,484,357 B2 | 11/2016 | Makala et al. | |
| 9,524,901 B2 | 12/2016 | Izumi et al. | |
| 9,589,978 B1 | 3/2017 | Yip | |
| 9,646,989 B1 * | 5/2017 | Yoshimizu | H01L 27/11578 |
| 9,673,213 B1 * | 6/2017 | Yu | H01L 23/535 |
| 9,691,658 B1 | 6/2017 | Alptekin et al. | |
| 9,698,152 B2 * | 7/2017 | Peri | H01L 21/28568 |
| 9,728,548 B2 | 8/2017 | Freeman et al. | |
| 9,991,280 B2 * | 6/2018 | Nakamura | H01L 27/11582 |
| 10,269,625 B1 | 4/2019 | Matovu et al. | |
| 2011/0031546 A1 * | 2/2011 | Uenaka | H01L 29/792 257/316 |
| 2011/0169071 A1 * | 7/2011 | Uenaka | H01L 27/105 257/326 |
| 2013/0056818 A1 * | 3/2013 | Iino | H01L 27/1157 257/324 |
| 2013/0161821 A1 | 6/2013 | Hwang et al. | |
| 2013/0341798 A1 | 12/2013 | Freeman et al. | |
| 2014/0061748 A1 | 3/2014 | Lee | |
| 2015/0064871 A1 | 3/2015 | Hopkins et al. | |
| 2016/0020157 A1 * | 1/2016 | Kitajima | B24B 49/105 438/10 |
| 2016/0020169 A1 * | 1/2016 | Matsuda | H01L 27/11548 257/758 |
| 2016/0111435 A1 * | 4/2016 | Pang | H01L 27/11556 438/270 |
| 2016/0133638 A1 | 5/2016 | Simsek-Ege et al. | |
| 2016/0322381 A1 * | 11/2016 | Liu | H01L 29/40114 |
| 2016/0365351 A1 | 12/2016 | Nishikawa et al. | |
| 2017/0062337 A1 | 3/2017 | Park et al. | |
| 2017/0062454 A1 * | 3/2017 | Lu | H01L 29/7926 |
| 2017/0117222 A1 | 4/2017 | Kim et al. | |
| 2017/0200736 A1 | 7/2017 | Park et al. | |
| 2017/0229472 A1 * | 8/2017 | Lu | H01L 21/3003 |
| 2017/0250194 A1 | 8/2017 | Lee et al. | |
| 2017/0358594 A1 | 12/2017 | Lu et al. | |
| 2018/0331117 A1 * | 11/2018 | Titus | H01L 27/11575 |

* cited by examiner

STAIR STEP STRUCTURES INCLUDING INSULATIVE MATERIALS, AND RELATED DEVICES

CROSS-REFERENCE TO RELATED APPLICATION

This application is a continuation of U.S. patent application Ser. No. 16/172,218, filed Oct. 26, 2018, now U.S. Pat. No. 10,600,682, issued Mar. 24, 2020, which is a continuation of U.S. patent application Ser. No. 15/857,197, filed Dec. 28, 2017, now U.S. Pat. No. 10,269,625, issued Apr. 23, 2019, and titled "METHODS OF FORMING SEMICONDUCTOR STRUCTURES HAVING STAIR STEP STRUCTURES," the disclosure of each of which is hereby incorporated herein in its entirety by this reference.

TECHNICAL FIELD

Embodiments disclosed herein relate to semiconductor devices including insulative materials located between regions of a stair step structure, and to related methods. More particularly, embodiments of the disclosure relate to semiconductor devices including insulative materials located between adjacent, facing regions of a stair step structure and having a portion thereof overlying an uppermost level of the stair step structure, and to related methods of forming the semiconductor structures of such semiconductor devices.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes semiconductor pillars extending through openings in tiers of conductive structures (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such electrical connections includes forming a so-called "stair step" structure at edges of the tiers of conductive structures. The stair step structure includes individual "steps" defining contact regions of the conductive structures upon which contact structures can be positioned to provide electrical access to the conductive structures.

As vertical memory array technology has advanced, additional memory density has been provided by forming vertical memory arrays to include additional tiers of conductive structures, and, hence, additional steps in the stair step structures associated therewith. A conventional process of forming a stair step structure may include repeated acts of trimming a uniform width of a mask (e.g., photoresist) overlying alternating conductive structures and insulating (e.g., dielectric) structures, etching portions of the insulating structures not covered by a remaining portion of the mask, and then etching portions of the conductive structures not covered by remaining portions of the insulating structures. As the number of memory cells in such vertical memory arrays increases, such as by increasing the number of memory cells in vertical strings of the vertical memory arrays, a depth (i.e., a height) of the stair step structure increases. In other words, the distance between, for example, a lowermost step and an uppermost step may increase as the number of memory cells in the vertical memory array increases. In addition, as the number of steps increases, a distance between facing regions of the stair step structure may exhibit a similar increase.

The increase in depth of the stair step structures and the increase in the distance between adjacent, facing regions of the stair step structure present problems in filling such regions with insulative materials. For example, chemical mechanical planarization of insulative materials located between adjacent regions of the stair step structure often undesirably removes portions of uppermost tiers of the stair step structure, such as of conductive word lines of the uppermost tiers. Damage to the conductive word lines may result in a damaged electrical connection between a conductive word line and memory cells intended to be electrically coupled to that conductive word line. If the damage to the conductive word lines is excessive enough, the vertical memory array may not work for its intended purpose and may fail, requiring scrapping of the semiconductor device including the vertical memory array.

DETAILED DESCRIPTION

Figure 1:
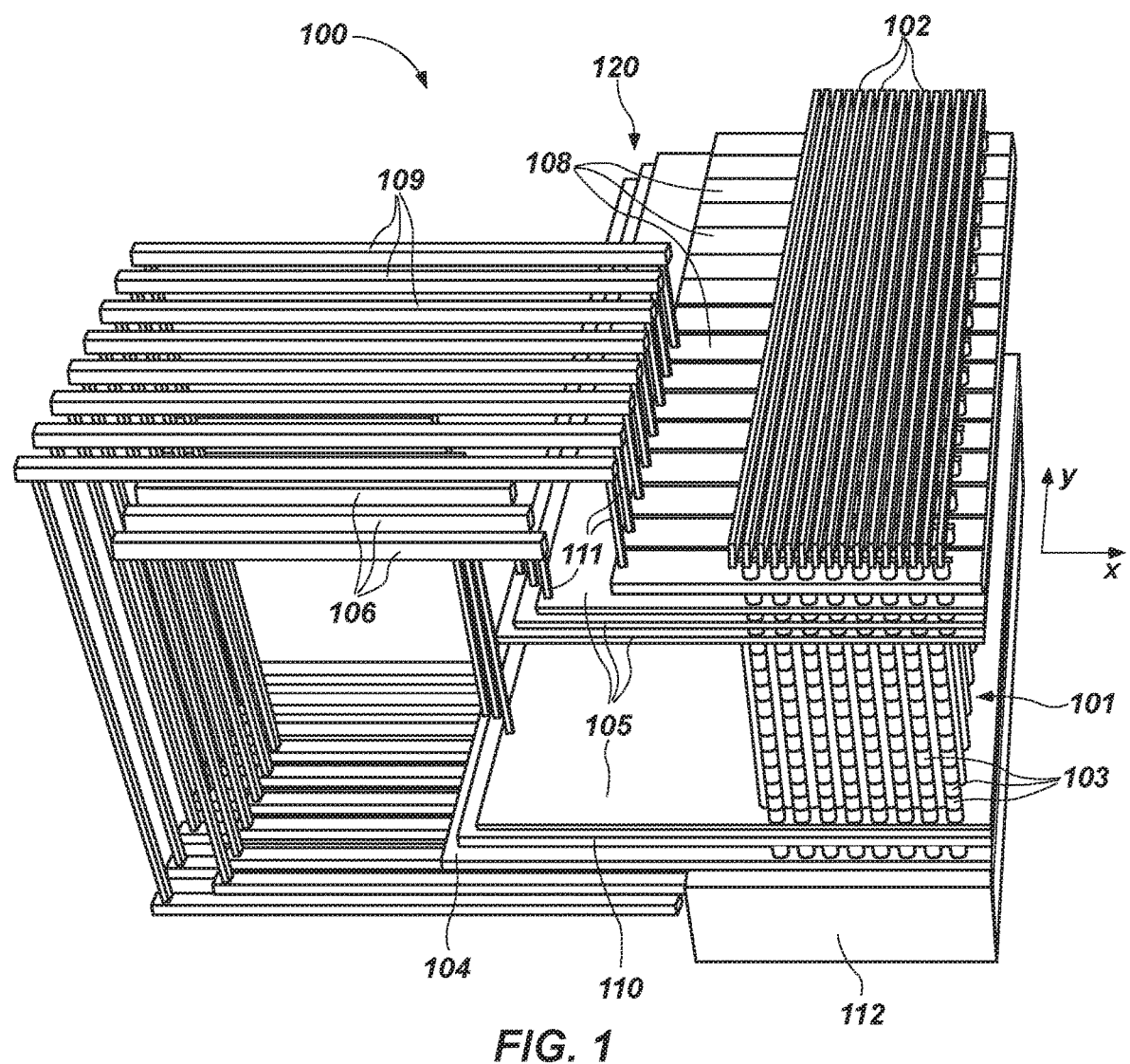
FIG. 1 is a partial cutaway perspective view of a vertical memory device including a stair step structure, in accordance with embodiments of the disclosure.

The illustrations included herewith are not meant to be actual views of any particular systems or semiconductor structures, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a stair step structure, a semiconductor structure, a semiconductor device, or a complete description of a process flow for manufacturing such stair step structures, semiconductor structures, or semiconductor devices. The structures described below do not form complete semiconductor structures or semiconductor devices. Only those process acts and structures necessary to understand the embodiments described herein are described in detail below. Additional acts to form a complete semiconductor stair step structure, semiconductor structure, or semiconductor device including the structures described herein may be performed by conventional techniques.

According to embodiments disclosed herein, semiconductor devices, such as a non-volatile memory device (e.g., three-dimensional NAND memory devices) including contact regions on so-called "stair steps" are disclosed, as are methods of forming stair step semiconductor structures of such semiconductor devices. The stair step semiconductor structure may include alternating regions (e.g., levels) of a conductive material (e.g., conductive access lines) and a dielectric (e.g., insulative) material. Each conductive material may be contacted at a contact region thereof by a conductive contact. Regions between adjacent, facing regions of a stair step structure may be substantially filled with an insulative material, which may be referred to herein as a so-called "gap-fill" material. The insulative material may extend from a lowermost step to a location overlying a portion of an uppermost step of the stair step structure. In other words, an upper surface of the insulative material may be further from (e.g., more distal to) a surface of a substrate on which the stair step structure is formed than the uppermost step of the stair step structure. The insulative material may substantially fill regions between regions of the stair step structure, such as between adjacent regions of the stair step structure. The insulative material may be formed and patterned (e.g., planarized) in the regions between different regions of the stair step structure using one or more sacrificial materials. A height of the insulative material between an upper surface of the uppermost step of the stair step structure and an uppermost surface of the insulative material may correspond to a thickness of the one or more sacrificial materials used during patterning of the insulative material.

The stair step structures formed according to the methods described herein may be less prone to device failure than stair step structures formed according to conventional methods. For example, the conductive materials (e.g., the conductive access line) of the uppermost stair steps may be not be thinned during planarization of the insulative material between the facing regions of the stair step structure. By way of comparison, an uppermost conductive word line of a stair step structure formed according to conventional methods may be thinned during fabrication of the insulative material. Accordingly, the stair step semiconductor structures and devices formed according to the methods described herein may exhibit a reduced failure rate compared to stair step semiconductor structures and devices formed according to conventional methods.

FIG. 1 is a partial cutaway perspective view of a portion of a semiconductor device 100 (e.g., a vertical memory device, such as a 3D NAND Flash memory device), according to embodiments of the disclosure. The semiconductor device 100 includes a stair step structure 120 for defining contact regions for connecting access lines 106 to conductive tiers 105 (e.g., conductive layers, conductive plates, etc.). The semiconductor device 100 may include vertical strings 101 of memory cells 103 that are coupled to each other in series. The vertical strings 101 may extend vertically and orthogonal to conductive lines and tiers 105, such as data lines 102, a source tier 104, the conductive tiers 105, the access lines 106, first select gates 108 (e.g., upper select gates, drain select gates (SGDs)), select lines 109, and a second select gate 110 (e.g., a lower select gate, a source select gate (SGS)).

Vertical conductive contacts 111 may electrically couple components to each other as shown. For example, the select lines 109 may be electrically coupled to the first select gates 108 and the access lines 106 may be electrically coupled to the conductive tiers 105. The semiconductor device 100 may also include a control unit 112 positioned under the memory array, which may include at least one of string driver circuitry, pass gates, circuitry for selecting gates, circuitry for selecting conductive lines (e.g., the data lines 102, the access lines 106, etc.), circuitry for amplifying signals, and circuitry for sensing signals. The control unit 112 may be electrically coupled to the data lines 102, the source tier 104, the access lines 106, the first select gates 108, and the second select gates 110, for example.

The first select gates 108 may extend horizontally in a first direction x (e.g., to the left and right from the perspective of FIG. 1) and may be coupled to respective first groups of vertical strings 101 of memory cells 103 at a first end (e.g., an upper end) of the vertical strings 101. The second select gate 110 may be formed in a substantially planar configuration and may be coupled to the vertical strings 101 at a second, opposite end (e.g., a lower end) of the vertical strings 101 of memory cells 103.

The data lines 102 (e.g., bit lines) may extend horizontally in a second direction y (e.g., up and down from the perspective of FIG. 1) that is at an angle (e.g., perpendicular) to the first direction in which the first select gates 108 extend. The data lines 102 may be coupled to respective second groups of the vertical strings 101 at the first end (e.g., the upper end) of the vertical strings 101. A first group of vertical strings 101 coupled to a respective first select gate 108 may share a particular vertical string 101 with a second group of vertical strings 101 coupled to a respective data line 102. Thus, a particular vertical string 101 may be selected at an intersection of a particular first select gate 108 and a particular data line 102.

The conductive tiers 105 (e.g., word line plates) may extend in respective horizontal planes. The conductive tiers 105 may be stacked vertically, such that each conductive tier 105 is coupled to all of the vertical strings 101 of memory cells 103, and the vertical strings 101 of the memory cells 103 extend vertically through the stack of conductive tiers 105. The conductive tiers 105 may be coupled to or may form control gates of the memory cells 103 to which the conductive tiers 105 are coupled. Each conductive tier 105 may be coupled to one memory cell 103 of a particular vertical string 101 of memory cells 103.

The first select gates 108 and the second select gates 110 may operate to select a particular vertical string 101 of the memory cells 103 between a particular data line 102 and the source tier 104. Thus, a particular memory cell 103 may be selected and electrically coupled to a data line 102 by operation of (e.g., by selecting) the appropriate first select gate 108, second select gate 110, and conductive tier 105 that are coupled to the particular memory cell 103.

The stair step structure 120 may be configured to provide electrical connection between the access lines 106 and the tiers 105 through the vertical conductive contacts 111. In other words, a particular level of the tiers 105 may be selected via an access line 106 in electrical communication with a respective conductive contact 111 in electrical communication with the particular tier 105.

Figure 2:
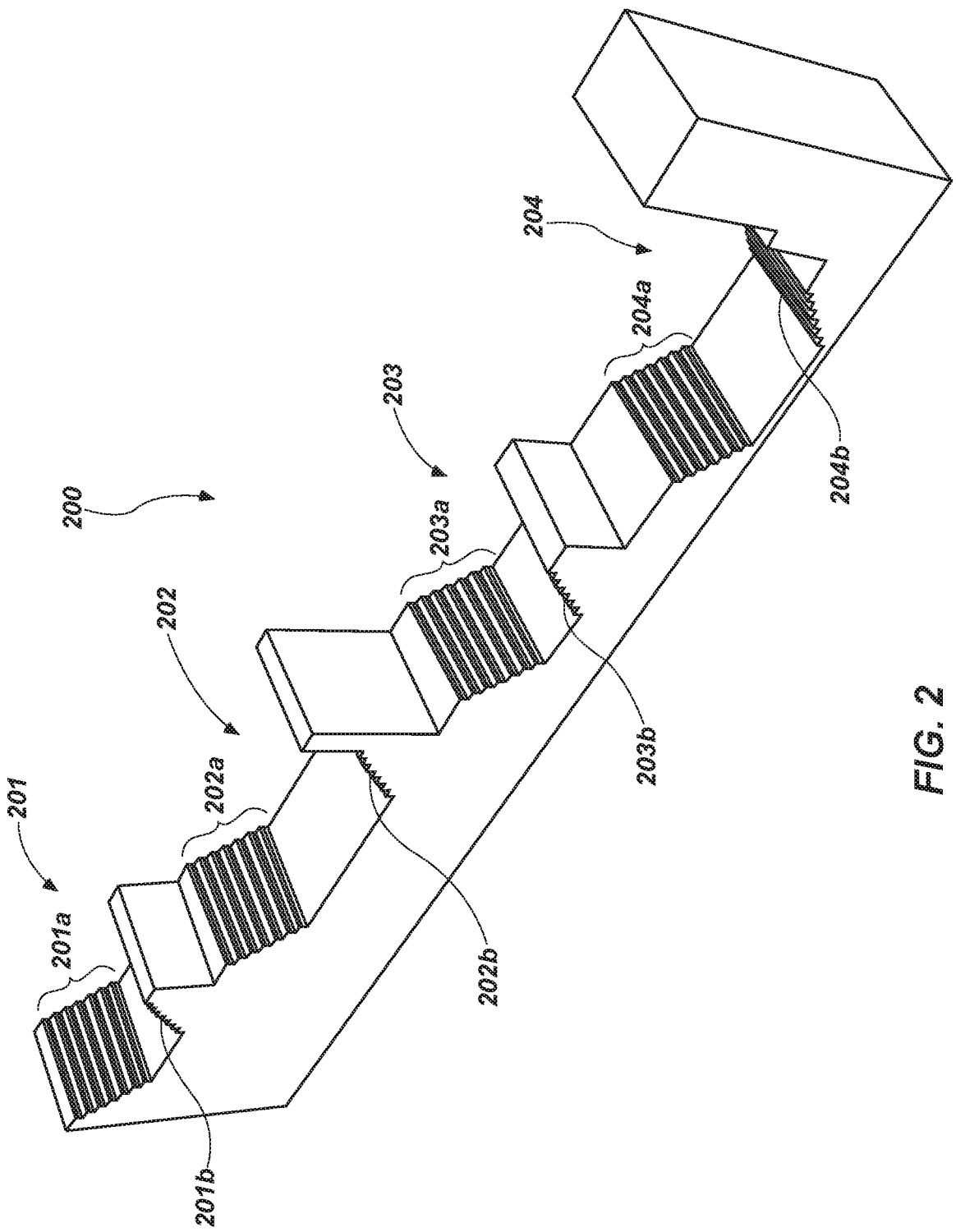
FIG. 2 is a perspective view illustrating a portion of a stair step structure, in accordance with embodiments of the disclosure.

FIG. 2 is a simplified perspective view of a stair step structure 200, in accordance with embodiments of the disclosure. The stair step structure 200 may be used to form contact regions to different tiers of conductive materials in the semiconductor device 100 described with reference to FIG. 1. The stair step structure 200 may include, for example, a first region 201 of stair steps, a second region 202 of stair steps, a third region 203 of stair steps, and a fourth region 204 of stair steps. In some embodiments, each region 201, 202, 203, 204 of stair steps may include laterally opposing portions of stair steps. For example, the first region 201 may include stair steps 201a and stair steps 201b opposing the stair steps 201a. Each step of the stair steps 201a may be electrically coupled to a conductive material and a conductive contact. In some embodiments, each stair step of the stair steps 201b may be electrically coupled to a conductive contact. In other embodiments, the stair steps 201b comprise dummy steps that are not electrically coupled to a conductive contact. Similarly, each of the second region 202, the third region 203, and the fourth region 204 may include stair steps 202a, 203a, 204a opposing stair steps 202b, 203b, 204b, respectively.

As described above, a conductive contact may be formed to the conductive portion of each tier of the stair steps. The conductive contacts may be electrically isolated from each other with an insulative material that may fill regions (e.g., valleys) between regions 201, 202, 203, 204 of the stair steps. As a number of stair steps increases, the depth of the region between the regions 201, 202, 203, 204 may exhibit a corresponding increase. However, as the depth increases, a difficulty of patterning the insulative material between the regions 201, 202, 203, 204 may increase.

As will be understood by those of ordinary skill in the art, although the stair step structures 120, 200 FIG. 1 and FIG. 2, respectively, have been described as having a particular structure, the disclosure is not so limited and the stair step structure may have different structures and orientations.

Figure 3A:
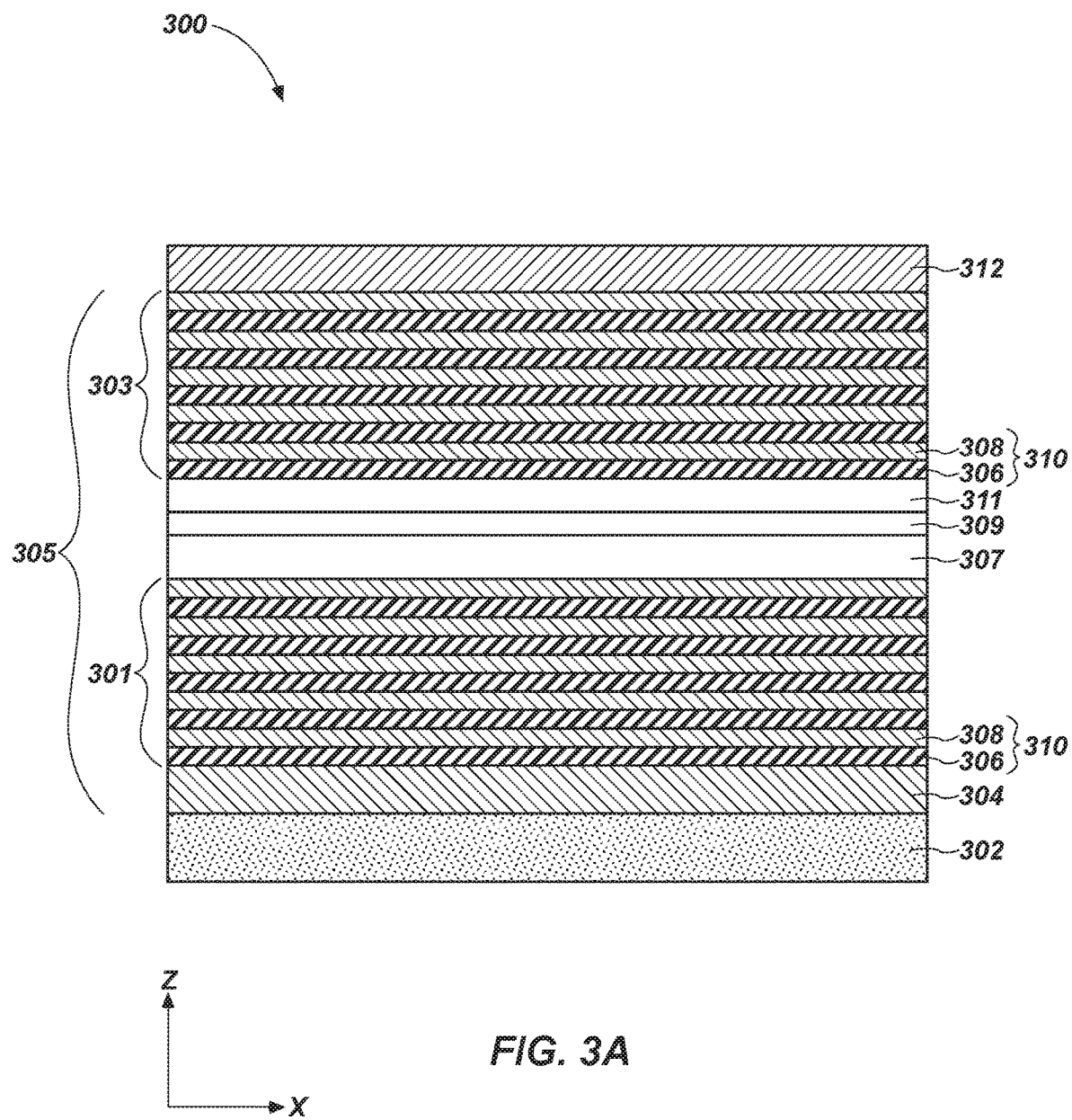
FIG. 3A through FIG. 3I illustrate a method of forming a stair step structure, in accordance with embodiments of the disclosure.

FIG. 3A through FIG. 3J illustrate a method of filling a region between different regions of a stair step structure, such as a region between opposing and facing stair step regions 201, 202, 203, 204 (FIG. 2). Referring to FIG. 3A, a semiconductor structure 300 may include a stack 305 of materials over a substrate 302. The stack 305 may extend in a third direction (e.g., the z direction).

The substrate 302 may be a semiconductor substrate, a base semiconductor material on a supporting substrate, a metal electrode, or a semiconductor substrate having one or more materials, structures, or regions formed thereon. The substrate 302 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation. The substrate 302 may include one or more materials associated with integrated circuitry fabrication. Such materials may include, for example, one or more refractory metals, barrier materials, diffusion materials, insulative materials, etc. The substrate 302 may include, for example, complementary metal oxide semiconductor (CMOS) structures, or other semiconductor structures.

The stack 305 may include a source select gate (SGS) 304 over the substrate 302 and alternating regions of a dielectric material 306 and another material 308. Each alternating region of the dielectric material 306 and the another material 308 may form a tier 310.

The source select gate 304 may include a conductive material. By way of nonlimiting example, the source select gate 304 may include polysilicon, a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum, alloys thereof), a conductive metal-containing material (e.g., a conductive metal nitride, a conductive metal silicide, a conductive metal oxide), a conductively-doped semiconductor material (e.g., conductively-doped silicon, conductively-doped germanium, conductively-doped silicon germanium), or combinations thereof. In some embodiments, the source select gate 304 comprises polysilicon.

The dielectric material 306 may include insulative materials such as an oxide material (e.g., silicon dioxide, phosphosilicate glass, borosilicate glass, fluorosilicate glass, titanium dioxide, zirconium dioxide, hafnium dioxide, tantalum oxide, magnesium oxide, aluminum oxide, or combinations thereof), tetraethyl orthosilicate (TEOS), a spin-on dielectric material, a nitride material (e.g., silicon nitride), an oxynitride material (e.g., silicon oxynitride), amorphous carbon, or combinations thereof. In some embodiments, the dielectric material 306 comprises silicon dioxide.

The another material 308 may include a conductive material or an insulative material. By way of nonlimiting example, the another material 308 may include a conductive material or a nitride material. For example, in processes such as so-called "replacement gate" processes, the another material 308 comprises an insulative material such as silicon nitride. In some such embodiments, the insulative material may subsequently be replaced with a conductive material (e.g., a conductive gate material) before completion of fabrication of the semiconductor structure. In other embodiments, such as in so-called "floating gate" processes, the another material 308 comprises a conductive material, such as, for example, polysilicon, aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), and combinations thereof. In some embodiments, the another material 308 comprises polysilicon.

In some embodiments, the stack 305 may include a first deck 301 and at least a second deck 303 comprising the tiers 310 of alternating regions of the dielectric material 306 and the another material 308. In some such embodiments, a nitride material 307 may overlie the first deck 301, an insulative material 309 may overlie the nitride material 307, and a dielectric material 311 may overlie the insulative material 309. The nitride material may comprise silicon nitride, the insulative material 309 may comprise silicon dioxide, and the dielectric material 311 may comprise aluminum oxide. Although FIG. 3A illustrates a first deck 301 and a second deck 303, the disclosure is not so limited and the semiconductor structure 300 may not include a nitride material, an insulative material, and a dielectric material between different portions of alternating regions of the dielectric material 306 and the another material 308.

Although FIG. 3A illustrates only 10 tiers 310 (i.e., 5 tiers 310 at the first deck 301 and 5 tiers 310 at the second deck 303), the disclosure is not so limited. The semiconductor structure 300 may include any number of tiers, such as at least about 16 tiers, at least about 32 tiers, at least about 36 tiers, at least about 64 tiers, at least about 72 tiers, at least about 128 tiers, or at least about 256 tiers. In other words, in some embodiments, the semiconductor structure 300 may include at least about 256 sets of the dielectric material 306 and the another material 308.

A sacrificial material 312 may be formed over the semiconductor structure 300. The sacrificial material 312 may overlie an uppermost tier 310 (i.e., a most distal tier 310 from the substrate 302) of the tiers 310. The sacrificial material 312 may be formed at a thickness greater than a thickness of each of the dielectric material 306 and the another material 308. In some embodiments, the sacrificial material 312 may be formed at a thickness greater than a thickness of each of the tiers 310. In some embodiments, the sacrificial material 312 may have a thickness between about 300 Å and about 3,000 Å, such as between about 300 Å and about 500 Å, between about 500 Å and about 1,000 Å, between about 1,000 Å and about 1,500 Å, between about 1,500 Å and about 2,000 Å, between about 2,000 Å and about 2,500 Å, or between about 2,500 Å and about 3,000 Å. In some embodiments, the thickness of the sacrificial material 312 is about 1,200 Å.

The sacrificial material 312 may be formulated and configured to exhibit an etch selectivity relative to an insulative material to be formed between regions of one or more stair step structures, as will be described herein. The sacrificial material 312 may include, by way of nonlimiting example, polysilicon, a dielectric material, a nitride material (e.g., silicon nitride), a metal oxide (e.g., aluminum oxide, titanium oxide, tantalum oxide, tungsten oxide, titanium dioxide, etc.), or combinations thereof. In some embodiments, the sacrificial material 312 comprises polysilicon.

Figure 3B:
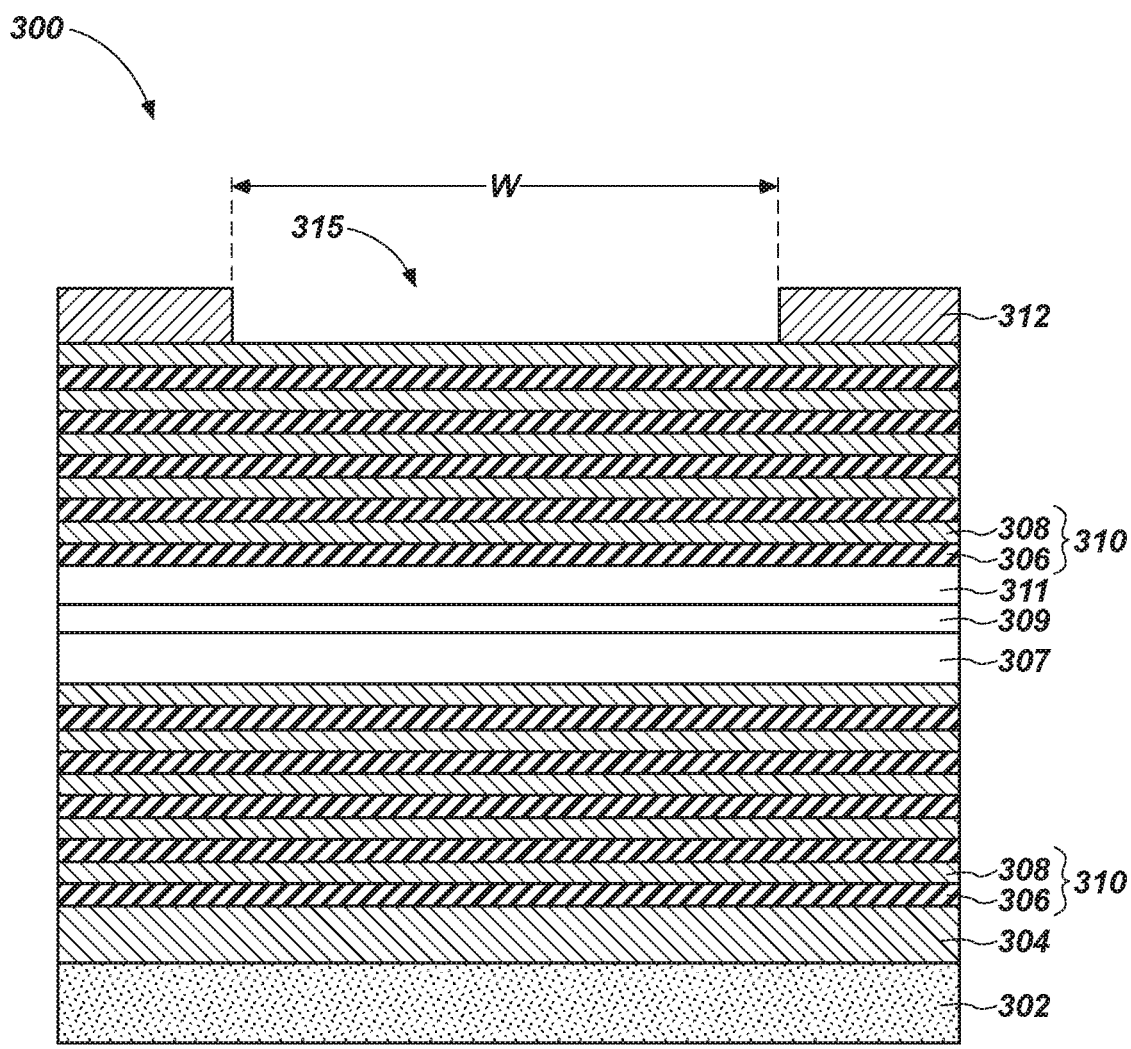

Referring to FIG. 3B, a portion of the sacrificial material 312 may be patterned to form an opening 315 in the sacrificial material 312 and expose a portion of the uppermost tier 310 through the opening 315. The sacrificial material 312 may be patterned by methods known in the art, such as by forming a mask (not shown) over the sacrificial material 312 and patterning the sacrificial material 312 through the mask.

A width W of the opening 315 may depend, at least in part, on a number of tiers 310 in the stair step structure. By way of nonlimiting example, the width W may be between about 5 μm and about 25 μm, such as between about 5 μm and about 10 μm, between about 10 μm and about 15 μm, between about 15 μm and about 20 μm, or between about 20 μm and about 25 μm. However, the disclosure is not so limited and the width W may be greater or smaller than those described.

Figure 3C:
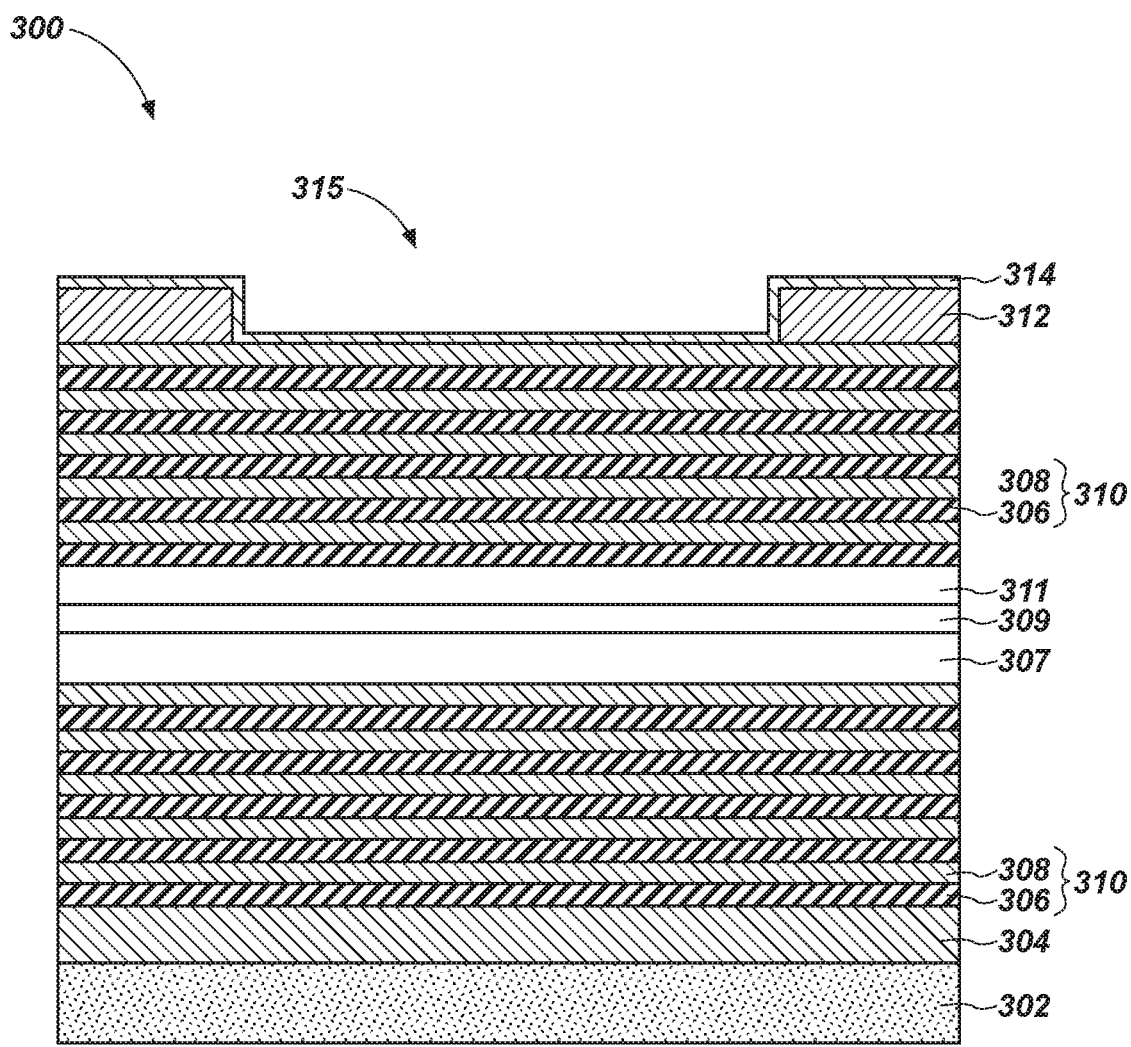
Figure 3C:
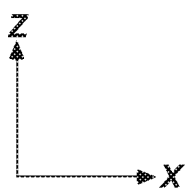

Referring to FIG. 3C, a mask material 314 may be formed over surfaces of the sacrificial material 312 and over exposed surfaces of the uppermost tier 310 (e.g., exposed surfaces of one of the another material 308 or the dielectric material 306). The mask material 314 may be formed conformally over the surfaces of the sacrificial material 312 and the surfaces of the tier 310 through the opening 315. In some embodiments, the mask material 314 comprises a nitride material such as silicon nitride.

Figure 3D:
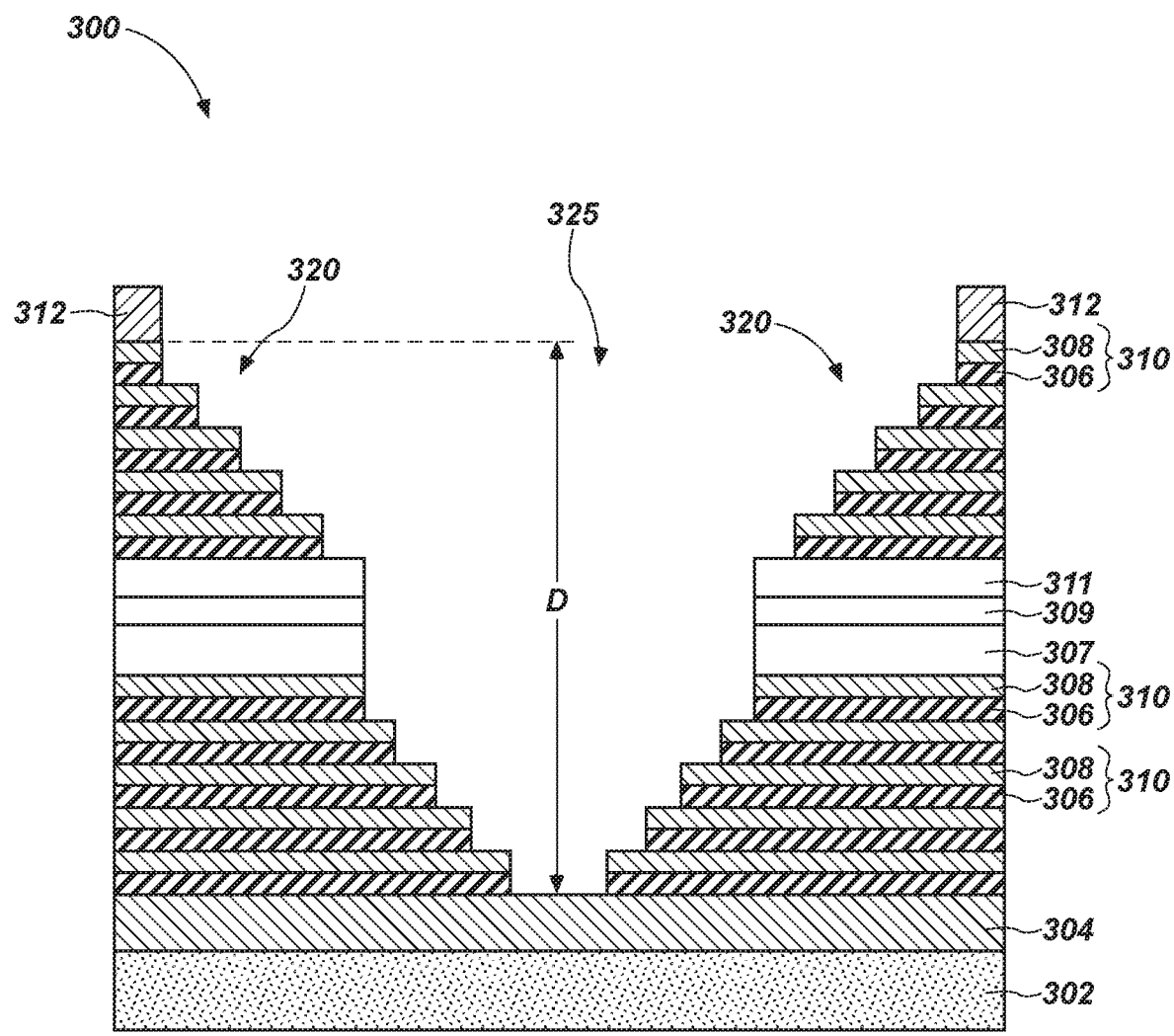

Referring to FIG. 3D, a portion of at least some of the tiers 310 may be removed (e.g., etched) through the mask material 314 to form a stair step structure 320. FIG. 3D is a cross-sectional view of the semiconductor structure 300 after patterning of the stair step structure 320.

The stair step structure 320 may be formed by methods known in the art and are, therefore, not described in detail herein. By way of nonlimiting example, a mask (e.g., the mask material 314) may be formed over the semiconductor structure 300. Such a mask may be referred to herein as a "stair step" mask as it is used to form a plurality of steps (e.g., contact regions) in the tiers 310. The stair step structure 320 may be formed by exposing a portion of the tiers 310 corresponding to a step through the mask and removing the exposed portion of the uppermost tier 310 by, for example, an anisotropic etch. The portion of the tier 310 may be removed by a first dry etch act that removes the exposed portion of the another material 308 to expose the underlying dielectric material 306, followed by a second dry etch act that removes the exposed portion of the dielectric material 306. The second dry etch act may expose the another material 308 of a tier 310 underlying the tier 310 in which the step was formed with the first dry etch act and the second dry etch act. The stair step structure 320 may be formed by removing a portion of the mask overlying the tiers 310 corresponding to a width of another step (e.g., such as with a trimming chemistry) and repeating the first dry etch act and the second dry etch act to form another step in the stair step region. Such methods of forming stair step structures are known in the art and are not described in detail herein.

The stair step structure 320 may include individual steps, each having a width sufficient to provide space for a conductive contact to be formed thereon. For example, the desired width of each step may be between about 100 nm and about 500 nm, although the disclosure is not so limited.

Formation of the stair step structure 320 produces a valley 325 (e.g., a gap) between facing regions (e.g., sides) of the stair step structure 320. As a number of tiers 310 (i.e., steps) in the stair step structure 320 increases, the depth D and, in some embodiments, the slope of the stair step structure 320 increases. In some embodiments, the depth D may be between about 3 μm and about 15 μm, such as between about 3 μm and about 6 μm, between about 6 μm and about 9 μm, between about 9 μm and about 12 μm, or between about 12 μm and about 15. However, the disclosure is not so limited and the depth D may be greater than the depths described above.

Figure 3E:
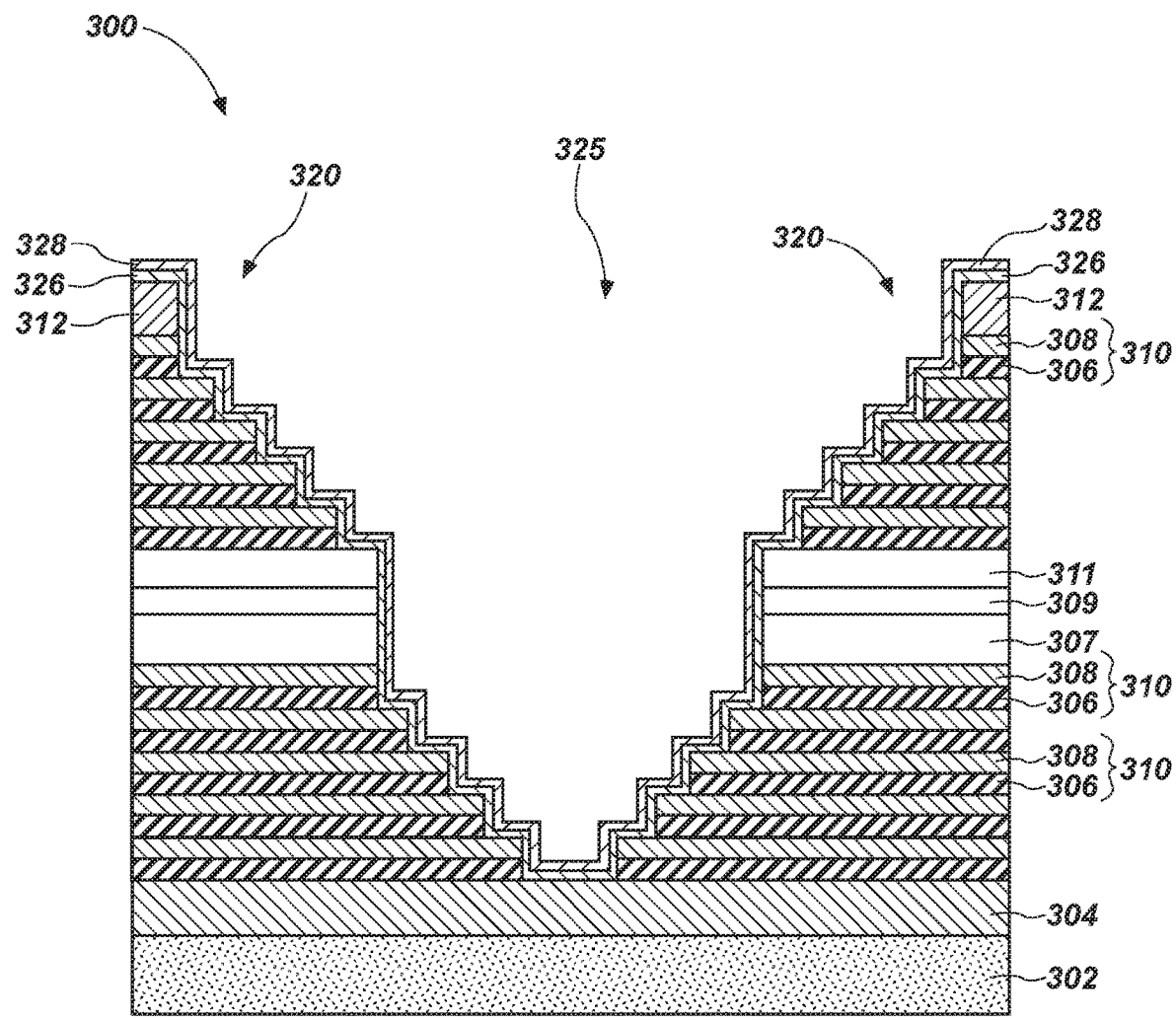

Referring to FIG. 3E, a first liner 326 and a second liner 328 may be formed over the semiconductor structure 300, such as within the valley 325 and over surfaces of the sacrificial material 312. In some embodiments, the first liner 326 and the second liner 328 are conformally formed over the semiconductor structure 300. The first liner 326 may include a dielectric material, such as, for example, a liner formed by a so-called "high aspect ratio process" (HARP). The first liner 326 may include an oxide material, such as, for example, tetraethyl orthosilicate (TEOS), silicon dioxide, a spin-on dielectric, another dielectric material, or combinations thereof. The second liner 328 may be formed conformally over the first liner 326. In some embodiments, the second liner 328 may include, for example, silicon nitride. In some embodiments, the second liner 328 may not be included and only the first liner 326 may be formed over the semiconductor structure 300.

A thickness of each of the first liner 326 and the second liner 328 may independently be between about 25 Å and about 150 Å, such as between about 25 Å and about 50 Å, between about 50 Å and about 75 Å, between about 75 Å and about 100 Å, between about 100 Å and about 125 Å, or between about 125 Å and about 150 Å. In some embodiments, the thickness of the first liner 326 and the second liner 328 may be about 50 Å, although the disclosure is not so limited.

The first liner 326 and the second liner 328 may be formed by, for example, atomic layer deposition (ALD), chemical vapor deposition (CVD), plasma-enhanced chemical vapor deposition (PECVD), low-pressure chemical vapor deposition (LPCVD), physical vapor deposition, or combinations thereof.

Figure 3F:
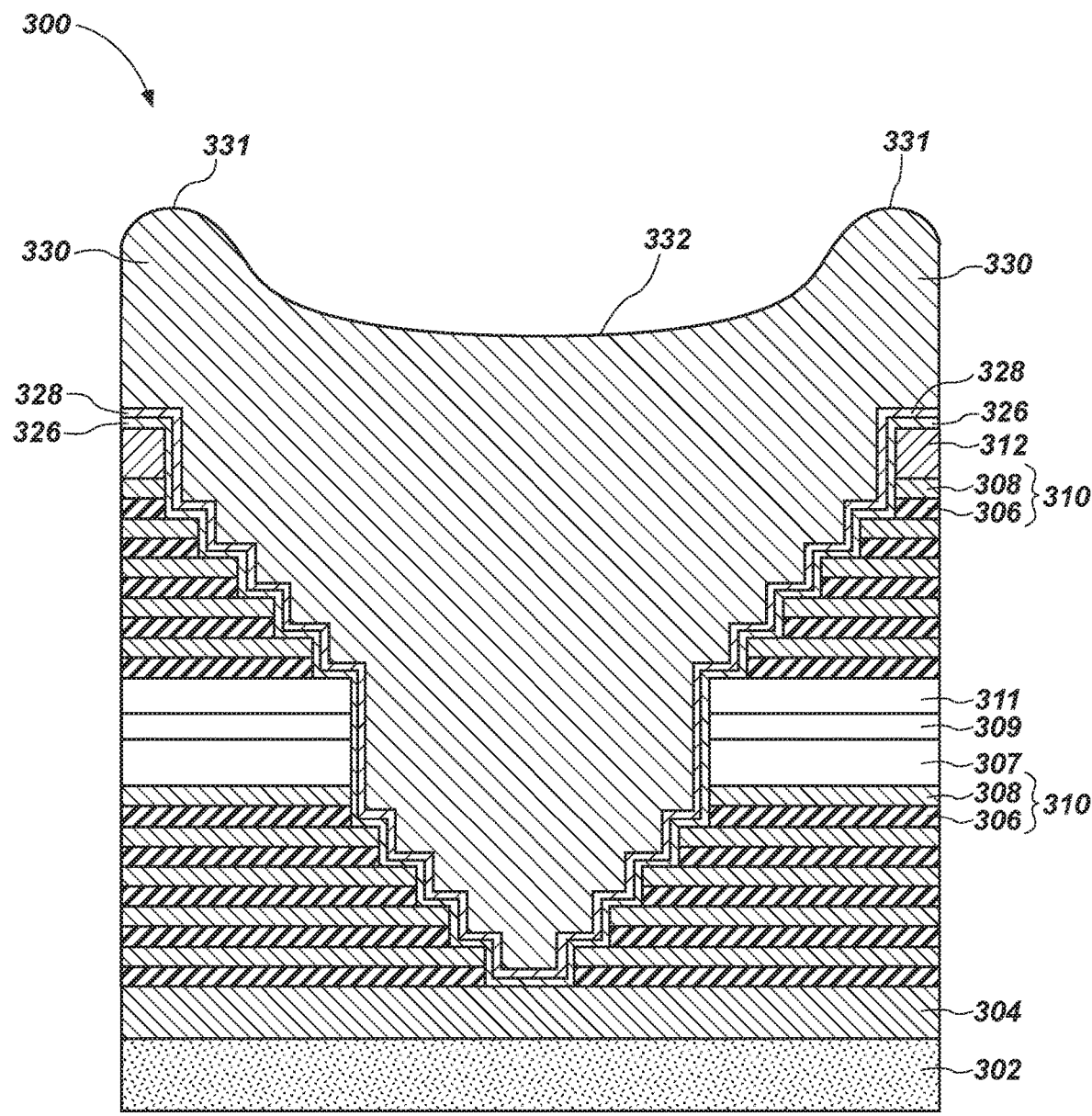

Referring to FIG. 3F, an insulative material 330 may be formed in the valley 325 (FIG. 3E) after forming the first liner 326 and the second liner 328. The insulative material 330 may substantially fill the valley 325 and may extend over surfaces of the second liner 328 at regions outside of the valley 325.

The insulative material 330 may be referred to herein and in the art as a so-called "gap-fill" material. The insulative material 330 may include raised portions 331 at locations that are directly above the uppermost tiers 310 and laterally offset from the valley 325 (FIG. 3E) and an arcuate (e.g., curved, dished, etc.) surface 332 at regions directly above the valley 325 (FIG. 3E). In other words, the insulative material 330 may include portions that extend further from a major surface of the substrate 302 at locations that are offset from the valley 325 (e.g., at portions that are directly above the uppermost tier 310) than other portions of the insulative material 330 (e.g., portions that are directly above the valley 325). In some embodiments, the arcuate surface 332 may define a bowl shape, a lowermost portion of the arcuate surface 332 proximate a laterally central portion of the valley 325.

The insulative material 330 may include any material suitable for providing electrical insulation between different regions of the stair step structure 320. By way of nonlimiting example, the insulative material 330 may include a spin-on dielectric material, TEOS, silicon dioxide, silicon nitride, phosphosilicate glass, borosilicate glass, fluorosilicate glass, another dielectric material, or combinations thereof. In some embodiments, the insulative material 330 comprises TEOS. In other embodiments, the insulative material 330 comprises a spin-on dielectric material. In yet other embodiments, a portion of the insulative material 330 comprises TEOS and another portion of the insulative material 330 comprises a spin-on dielectric material.

Figure 3G:
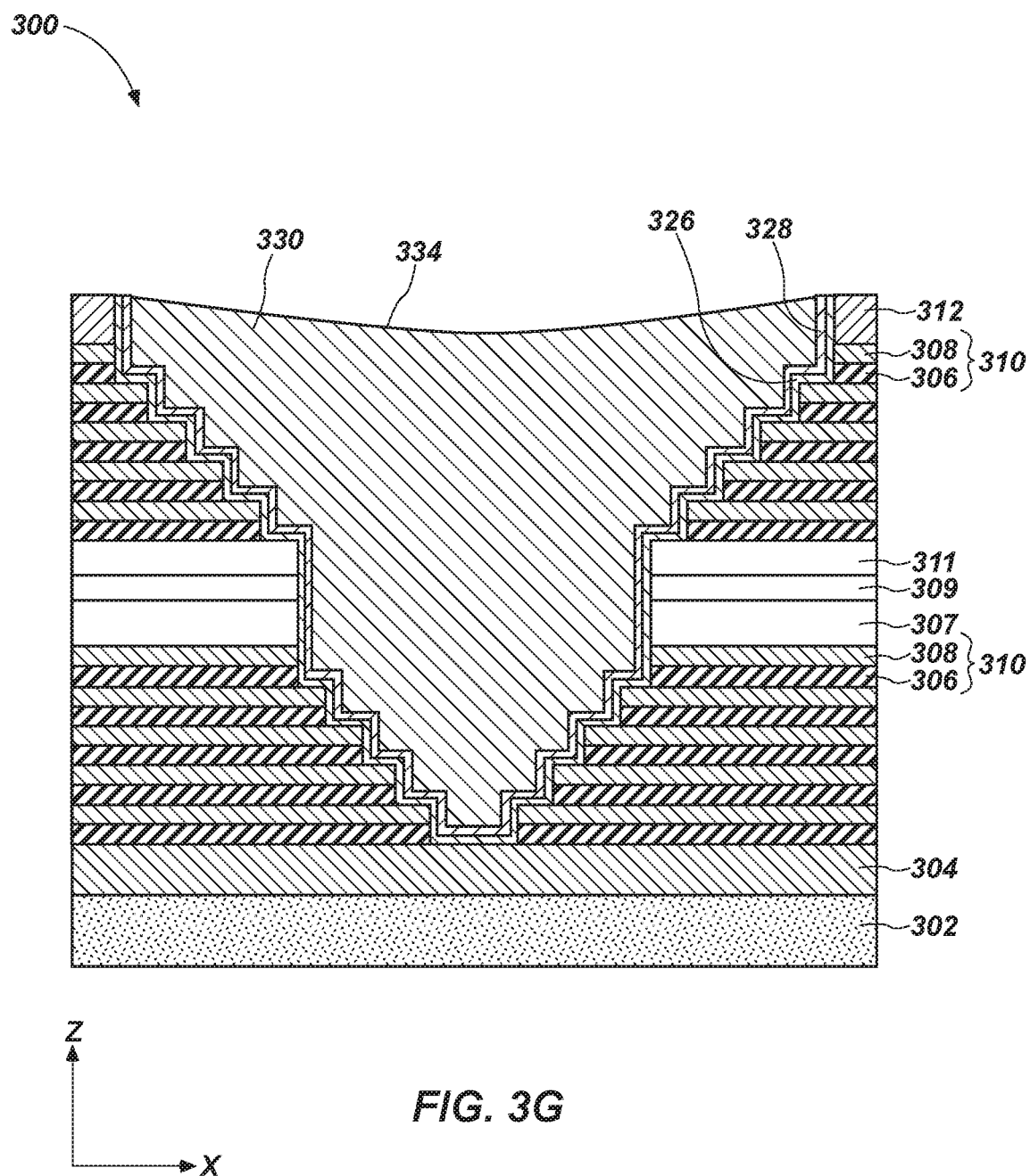

Referring to FIG. 3G, a portion of the insulative material 330 extending above surfaces of the semiconductor structure 300 may be removed so that at least a portion of an upper surface of the insulative material 330 is substantially coplanar with an upper surface of the sacrificial material 312. The insulative material 330 may be removed with, for example, a chemical mechanical planarization (CMP, also referred to as chemical mechanical polishing) process to planarize at least a portion of the insulative material. Removal of the portion of the insulative material 330 may expose surfaces of the sacrificial material 312. Exposing the insulative material 330 to the chemical mechanical planarization process may form a portion of the insulative material 330 to be coplanar with a surface of the sacrificial material 312. As used herein, the term "planarize" means and includes forming at least a portion of a surface to be substantially coplanar with at least another portion of the surface, at least a portion of another surface, or both. In some embodiments, removing the insulative material 330 may form an exposed surface 334 of the insulative material 330 having an arcuate shape corresponding to the surface 332 (FIG. 3F). In some embodiments, a lowermost portion of the arcuate surface 334 may be located more distal from the substrate 302 than the uppermost tier 310 is located from the substrate 302. A laterally central portion of the insulative material 330 (i.e., a portion of the insulative material 330 located directly above the valley 325 (FIG. 3E)) may be located closer to a major surface of the substrate 302 than other portions of the insulative material 330 (i.e., portions of the insulative material 330 proximate the sacrificial material 312).

With continued reference to FIG. 3G, exposing the insulative material 330 to the chemical mechanical planarization process may include removing portions of the second liner 328 and the first liner 326 from surfaces of the sacrificial material 312. In some embodiments, the chemical mechanical planarization process may remove portions of the insulative material 330, the second liner 328, and the first liner 326 located directly above surfaces of the uppermost tier 310.

The chemical mechanical planarization process may employ a slurry exhibiting a selectivity to the sacrificial material 312 relative to each of the insulative material 330, the first liner 326, and the second liner 328. Stated another way, the slurry of the chemical mechanical planarization process may not substantially remove the sacrificial material 312 while removing portions of the insulative material 330, the first liner 326, and the second liner 328. In some embodiments, the selectivity of the slurry may be greater than about 20:1, greater than about 30:1, or greater than about 40:1, although the disclosure is not so limited. The chemical mechanical planarization process may be configured to stop after the sacrificial material 312 is exposed (i.e., after the insulative material 330, the second liner 328, and the first liner 326 over the sacrificial material 312 are substantially removed). Since the chemical mechanical planarization process may be configured to stop on the sacrificial material 312, the sacrificial material 312 may be referred to as a so-called "stop-on" material and the process of removing the insulative material, the first liner 326, and the second liner 328 may be referred to as a so-called "stop-on" process.

In some embodiments, the slurry used during the chemical mechanical planarization process may comprise a colloidal suspension of silica, ceria ($CeO_2$), another material, or combinations thereof dispersed in an acidic solution (e.g., phosphoric acid, an organic acid (e.g., carboxylic acid), and combinations thereof) or a basic solution. In some embodiments, the slurry may include an oxidizing agent, such as, for example, hydrogen peroxide.

Figure 3H:
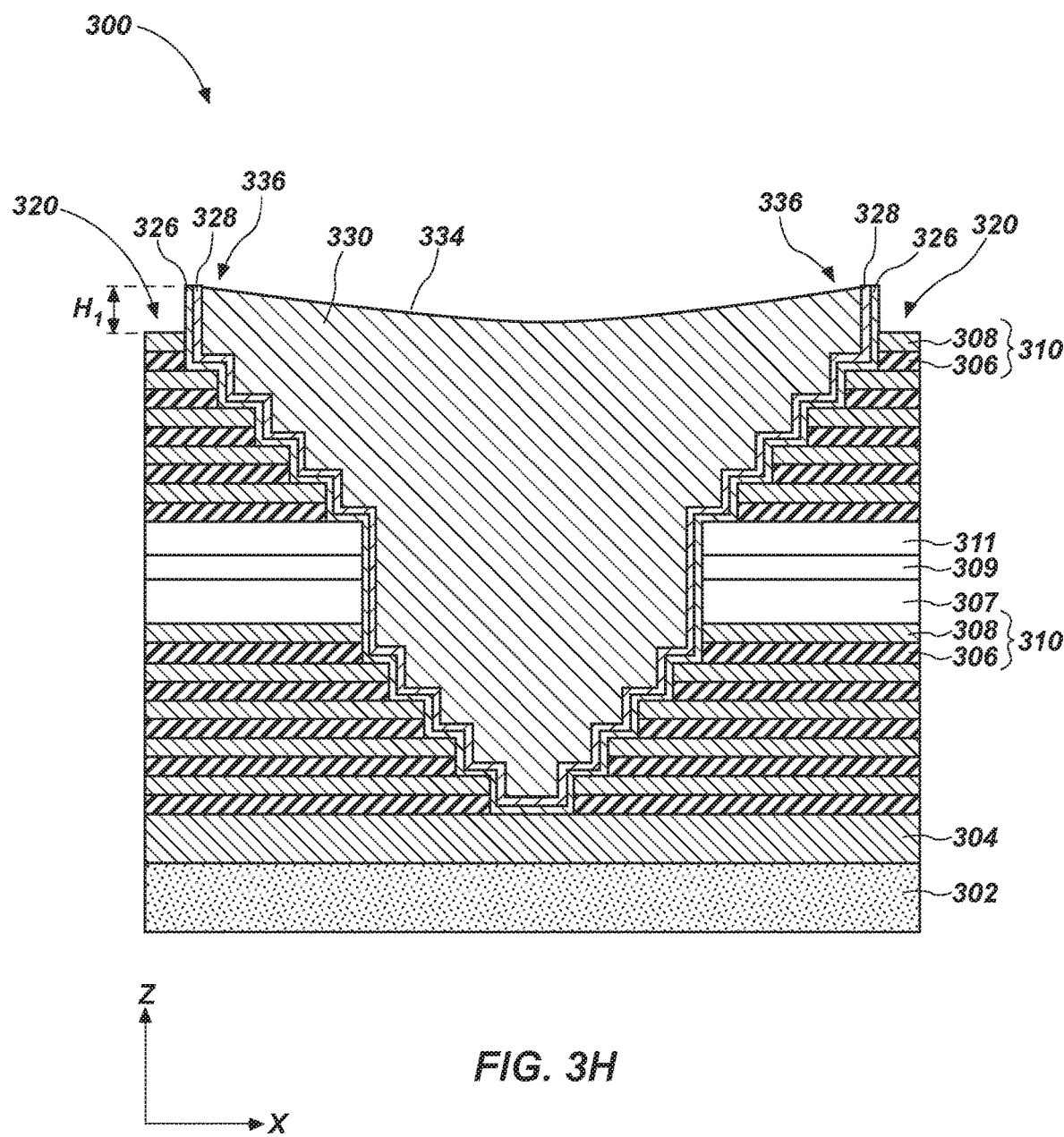

Referring to FIG. 3H, after planarizing the insulative material 330 and removing the insulative material 330, the second liner 328, and the first liner 326 from surfaces of the sacrificial material 312, the sacrificial material 312 may be removed from the semiconductor structure 300. The sacrificial material 312 may be removed, such as by dry etching or wet stripping. In some embodiments, excess insulative material 330 may be removed by exposing the semiconductor structure 300 to a dry etch gas comprising $CF_4$, $CH_2F_2$, and helium and the sacrificial material 312 is removed by exposing the sacrificial material 312 to a dry etch gas comprising HBr, helium, and oxygen ($O_2$). In other embodiments, the sacrificial material 312 may be exposed to a solution comprising hydrofluoric acid, nitric acid, tetramethylammonium hydroxide (TMAH), or combinations thereof to remove the sacrificial material 312 selective to the insulative material 330. However, the disclosure is not so limited, and the sacrificial material 312 may be removed by other methods or with other materials.

Removal of the sacrificial material 312 may leave so-called "wing" portions 336 of the insulative material 330, the first liner 326, and the second liner 328 extending over surfaces of the semiconductor structure 300, such as directly on surfaces of the uppermost tier 310. The wing portions 336 may comprise a portion of the insulative material 330 extending laterally beyond sidewalls defining the valley 325 (FIG. 3E) (i.e., sidewalls of the second liner 328 within the valley 325) between the facing regions of the stair step structure 320. In other words, the wing portions 336 may be defined by portions of the insulative material 330 extending directly over the uppermost tier 310 and laterally offset from the valley 325 (FIG. 3E). The portions of the insulative material 330 that are most distal from the surface of the substrate 302 may have a greater lateral width than other portions of the insulative material 330. A laterally outermost portion of the insulative material 330 may be in contact with a portion of second liner 328, which in turn, may be in contact with a portion of the first liner 326. The portion of the first liner 326 and the portion of the second liner 328 may extend in an upward direction away from the major surface of the substrate 302.

The wing portions 336 may extend above a surface of the uppermost tier 310 a height $H_1$, which may be referred to herein as a "step height". The height $H_1$ may correspond to an as-formed thickness of the sacrificial material 312, which has subsequently been removed. In some embodiments, the height $H_1$ may be between about 300 Å and about 3,000 Å, such as between about 300 Å and about 500 Å, between about 500 Å and about 1,000 Å, between about 1,000 Å and about 1,500 Å, between about 1,500 Å and about 2,000 Å, between about 2,000 Å and about 2,500 Å, or between about 2,500 Å and about 3,000 Å. In some embodiments, the height $H_1$ may be about 1,200 Å.

In some embodiments, after formation and planarization of the insulative material 330, holes (e.g., vias) may be formed through the insulative material 330 and filled with a conductive material to form electrical contacts to conductive portions of the tiers 310 (e.g., the another material 308). The holes filled with the conductive material may correspond to, for example, the vertical conductive contacts 111 (FIG. 1).

Figure 3I:
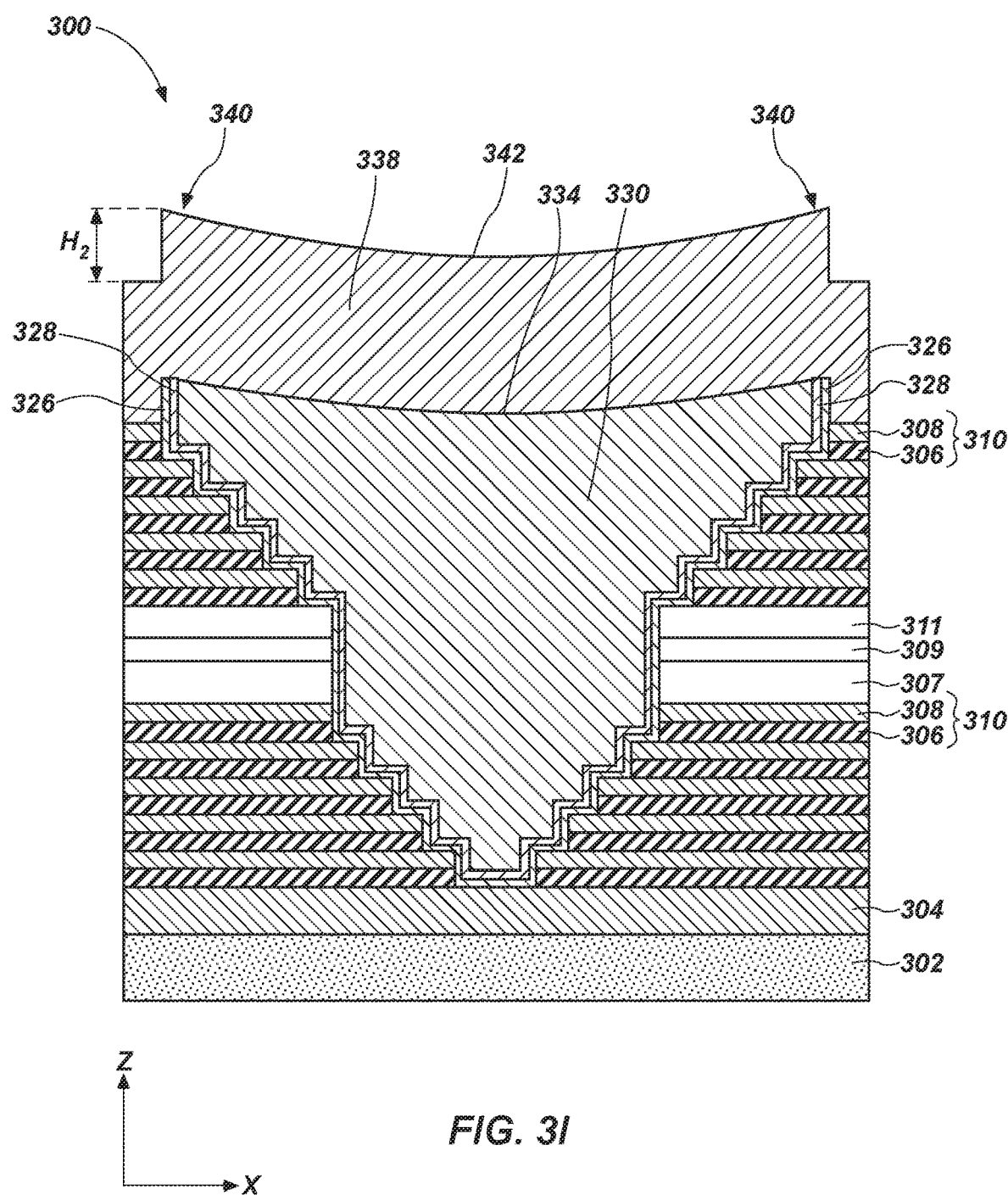

Referring to FIG. 3I, another insulative material 338 may be formed over the semiconductor structure 300. The another insulative material 338 may be formed over surfaces of the semiconductor structure 300 and maintain the topography of the semiconductor structure 300. Accordingly, portions of the another insulative material 338 directly above the valley 325 (FIG. 3E) (i.e., directly above the laterally central portion of the insulative material 330) may extend further from the major surface of the substrate 302 than other portions of the another insulative material 338.

The another insulative material 338 may include an electrically insulative nitride material, an oxide material (e.g., silicon dioxide), or a combination thereof. In some embodiments, the another insulative material 338 comprises silicon nitride. In other embodiments, the another insulative material 338 comprises silicon dioxide.

The another insulative material 338 may include wing portions 340 corresponding to the wing portions 336 (FIG. 3H) of the insulative material 330. In some embodiments, the another insulative material 338 includes a surface 342 having an arcuate shape (e.g., a bowl shape), a lower portion of the arcuate shape located at a laterally central portion of the another insulative material 338. A height $H_2$ of the another insulative material 338 may correspond to the height $H_1$ (FIG. 3I) of the wing portions 336 (FIG. 3H) of the insulative material 330.

The semiconductor structure 300 may exhibit a reduced failure rate because a topmost tier 310 may not be subjected to thinning during the chemical mechanical planarization of the insulative material 330 between the facing regions of the stair step structure 320. Since the insulative material 330, the first liner 326, and the second liner 328 overlie the uppermost tier 310, the chemical mechanical planarization process that removes portions of the insulative material 330 may be configured to stop responsive to exposure of the sacrificial material 312 (as described above with reference to FIG. 3G). Therefore, portions of the uppermost tier 310 are not substantially removed by the chemical mechanical planarization process. In addition, the use of the sacrificial material 312 may facilitate planarizing an insulative material in regions (i.e., valleys 325 (FIG. 3E)) having greater depths than conventional semiconductor structures without damaging portions of the tiers of the stair step structure 320. The semiconductor structure 300 including the insulative material 330 may also be less prone to cracking between different gap-fill oxide materials than conventional semiconductor structures.

Accordingly, in some embodiments, a method of forming a semiconductor structure comprises forming a sacrificial material over a stack comprising alternating levels of a dielectric material and another material, forming an opening through the sacrificial material and at least some of the alternating levels of the dielectric material and the another material, forming at least one oxide material in the opening and overlying surfaces of the sacrificial material, an uppermost surface of the at least one oxide material extending more distal from a surface of a substrate than an uppermost level of the dielectric material and the another material, planarizing at least a portion of the at least one oxide material to expose a portion of the sacrificial material, and removing the sacrificial material while the uppermost surface of the at least one oxide material remains more distal from the surface of the substrate than the uppermost level of the alternating levels of the dielectric material and the another material.

Figure 4A:
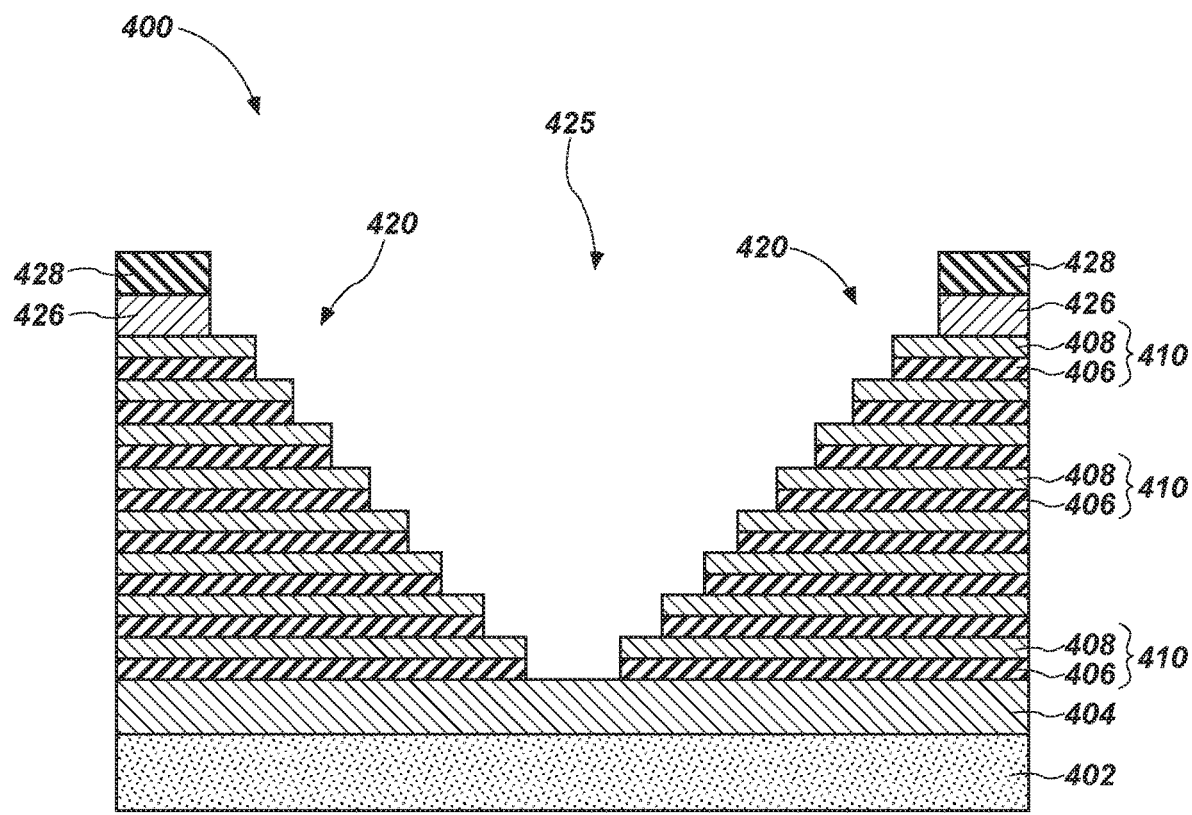
FIG. 4A through FIG. 4G illustrate another method of forming a stair step structure, in accordance with other embodiments of the disclosure.

Referring to FIG. 4A through FIG. 4G, another method of forming a semiconductor structure including facing stair step regions of one or more stair step structures and an insulative material in a valley between the stair step regions is described. Referring to FIG. 4A, a semiconductor structure 400 including a stair step structure 420 may be formed.

The stair step structure 420 may include tiers 410 comprising alternating regions of a dielectric material 406 and another material 408. The dielectric material 406 and the another material 408 may be substantially the same as the dielectric material 306 and the another material 308 described above with reference to FIG. 3A. The stair step structure 420 may overlie a source select gate 404 overlying a substrate 402, which may be substantially the same as the source select gate 304 and the substrate 302, respectively, described above with reference to FIG. 3A.

The stair step structure 420 may be formed by, for example, the same method described above with reference to formation of the stair step structure 320 of FIG. 3D and FIG. 3E.

A first sacrificial material 426 may overlie an uppermost tier 410 of the stair step structure 420 and a second sacrificial material 428 may directly overlie the first sacrificial material 426. The first sacrificial material 426 and the second sacrificial material 428 may be selected to exhibit an etch selectivity relative to one another during material removal processes. In other words, the materials of the first sacrificial material 426 and the second sacrificial material 428 may be selected such that at least some material removal acts may remove the first sacrificial material 426 while not substantially removing the second sacrificial material 428 and at least other material removal acts may remove the second sacrificial material 428 while not substantially removing the first sacrificial material 426.

The first sacrificial material 426 may comprise polysilicon, a metal oxide (e.g., titanium dioxide, zirconium dioxide, hafnium dioxide, tantalum oxide, magnesium oxide, aluminum oxide, or combinations thereof), a dielectric material, another material, or combinations thereof. In some embodiments, the first sacrificial material 426 comprises polysilicon. The second sacrificial material 428 may comprise a nitride material, such as silicon nitride.

A thickness of the first sacrificial material 426 may be between about 300 Å and about 3,000 Å, such as between about 300 Å and about 500 Å, between about 500 Å and about 1,000 Å, between about 1,000 Å and about 1,500 Å, between about 1,500 Å and about 2,000 Å, between about 2,000 Å and about 2,500 Å, or between about 2,500 Å and about 3,000 Å.

A thickness of the second sacrificial material 428 may be between about 300 Å and about 3,000 Å, such as between about 300 Å and about 500 Å, between about 500 Å and about 1,000 Å, between about 1,000 Å and about 1,500 Å, between about 1,500 Å and about 2,000 Å, between about 2,000 Å and about 2,500 Å, or between about 2,500 Å and about 3,000 Å.

Figure 4B:
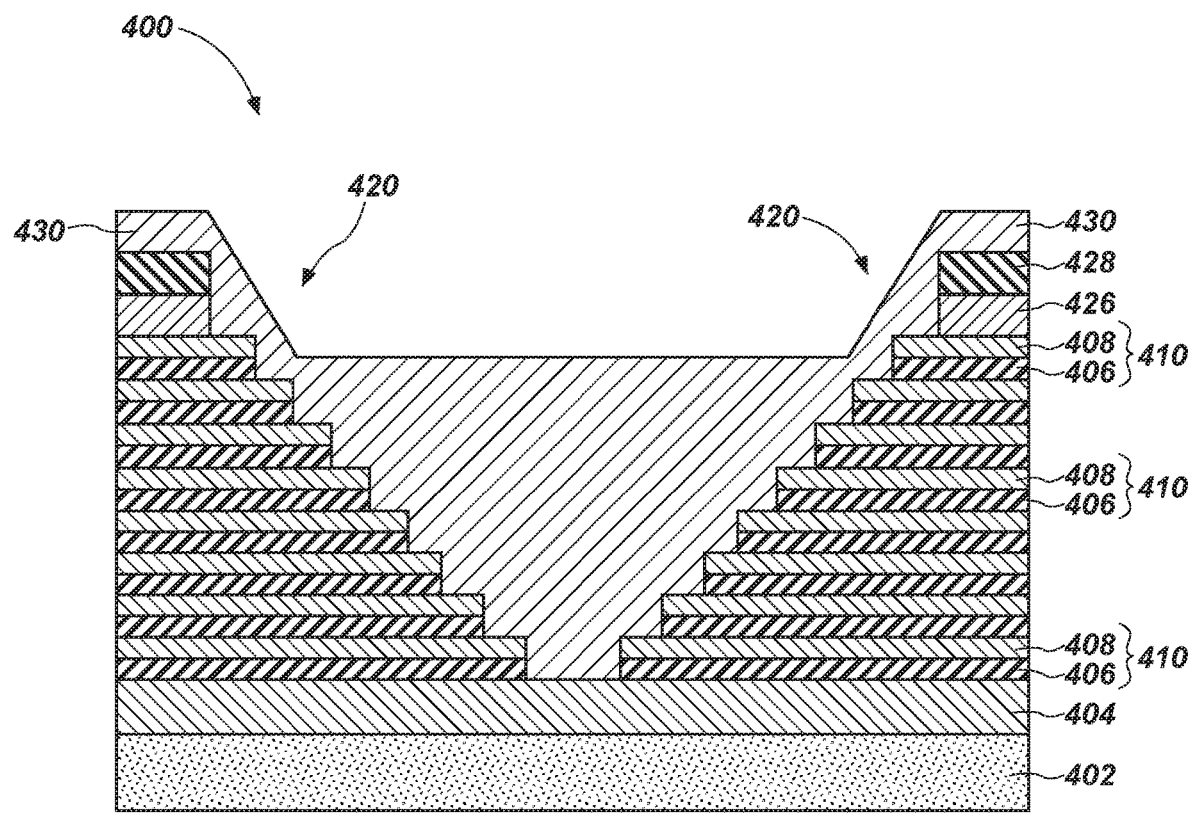

The ascending tiers 410 of the stair step structure 420 may define a valley 425 between the one or more regions of the stair step structure 420. Referring to FIG. 4B, the valley 425 (FIG. 4A) may be partially filled with a first insulative material 430. The first insulative material 430 may be substantially the same as the insulative material 330 described above with reference to FIG. 3G. By way of nonlimiting example, the first insulative material 430 may comprise a spin-on dielectric, TEOS, silicon dioxide, silicon nitride, phosphosilicate glass, borosilicate glass, fluorosilicate glass, another dielectric material, or combinations thereof. In some embodiments, the first insulative material 430 comprises TEOS. In other embodiments, the first insulative material 430 comprises a spin-on dielectric. In yet other embodiments, a portion of the first insulative material 430 comprises TEOS and another portion of the first insulative material 430 comprises a spin-on dielectric.

The first insulative material 430 may overlie surfaces of the semiconductor structure 400, including the exposed portions of the tiers 410 (corresponding to contact locations for forming conductive contacts to the tiers 410) and the second sacrificial material 428. In some embodiments, an exposed surface of the first insulative material 430 directly over the valley 425 (FIG. 4A) may be located closer to a major surface of the substrate 402 than an exposed surface of the first insulative material 430 located directly over the second sacrificial material 428 and laterally offset from the valley 425 (FIG. 4A).

Figure 4C:
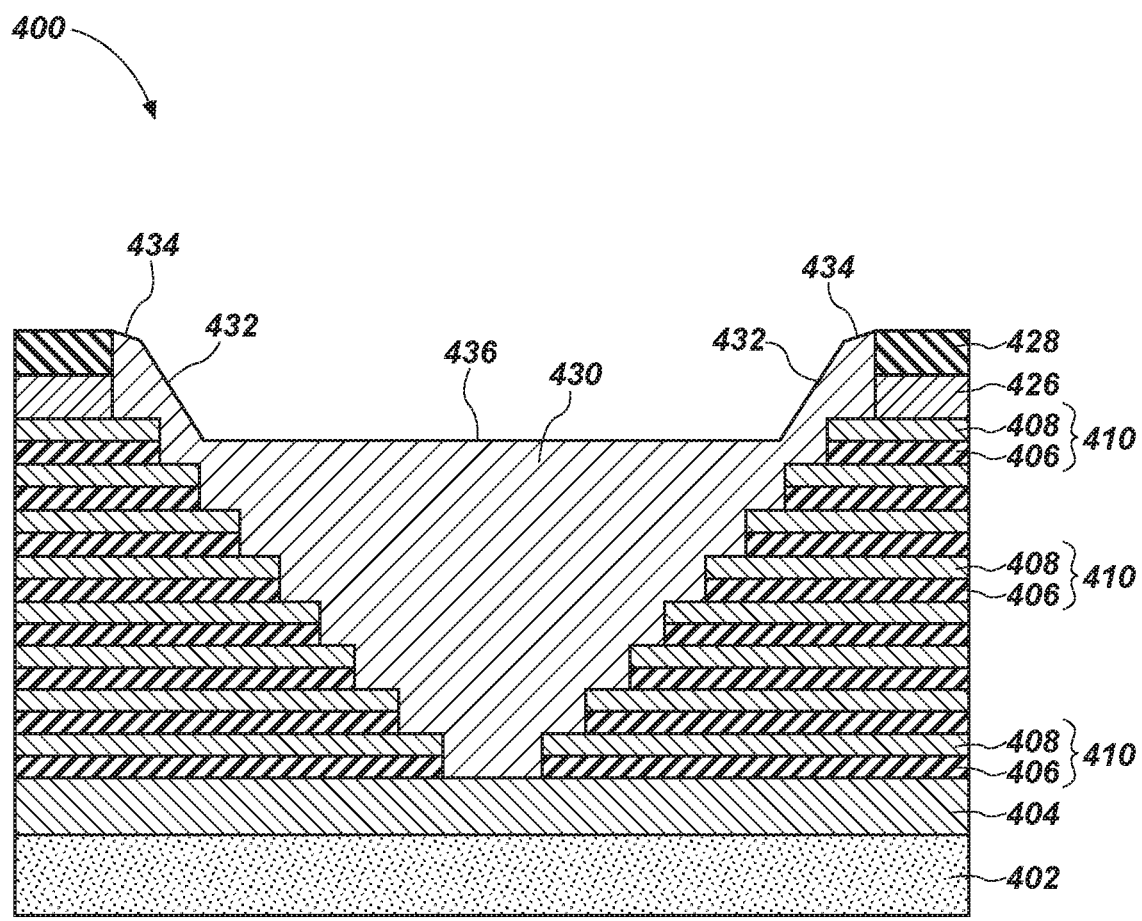

Referring to FIG. 4C, a portion of the first insulative material 430 may be removed from surfaces of the second sacrificial material 428 to expose surfaces of the second sacrificial material 428. The portions of the first insulative material 430 may be removed by, for example, chemical mechanical planarization, which may planarize a major surface 436 of the first insulative material 430. In some embodiments, the process by which the first insulative material 430 is removed may be selective to relative to the second sacrificial material 428. In other words, the chemical mechanical planarization process may not substantially remove the second sacrificial material 428 while substantially removing the first insulative material 430. The chemical mechanical planarization process and the second sacrificial material 428 may be formulated and configured to stop at an uppermost surface of the second sacrificial material 428. In other words, the chemical mechanical planarization process may selectively remove the first insulative material 430 without substantially removing the second sacrificial material 428.

In some embodiments, after removing a portion of the first insulative material 430, a laterally central portion of the first insulative material 430 may be located closer to a major surface of the substrate 402 than laterally outward portions of the first insulative material 430 (i.e., portions of the first insulative material 430 that are laterally offset from the valley 425 (FIG. 4A)). Portions of the first insulative material 430 that are laterally offset from the valley 425 may include first angled surfaces 432 extending from the major surface 436 of the first insulative material 430 toward the second sacrificial material 428. Proximate the second sacrificial material 428, the first angled surfaces 432 may transition to second angled surfaces 434, wherein the second angled surfaces 434 exhibit a reduced angle with respect to the major surface 436 of the first insulative material 430 relative to an angle between the major surface 436 and the first angled surfaces 432.

Figure 4D:
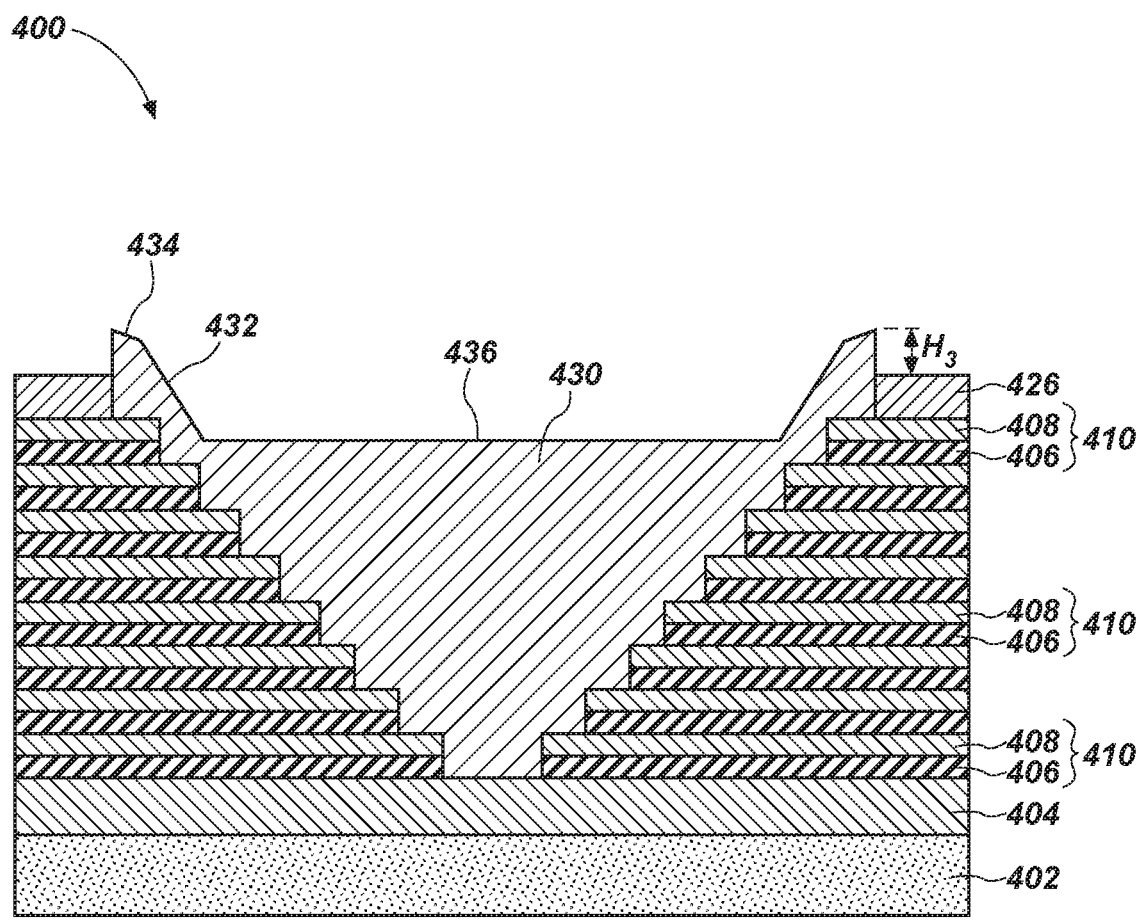

Referring to FIG. 4D, after planarizing the first insulative material 430, the second sacrificial material 428 may be removed from the semiconductor structure 400 to expose the first sacrificial material 426. By way of nonlimiting example, the second sacrificial material 428 may be selectively removed from the first sacrificial material 426 by dry etching the second sacrificial material 428 or by wet stripping the second sacrificial material 428. In some embodiments, the second sacrificial material 428 is removed by exposing the second sacrificial material 428 to a dry etch gas comprising $CH_4$, $CH_2F_2$, and helium or another dry etch gas. In other embodiments, the second sacrificial material 428 may be exposed to, for example, a solution comprising phosphoric acid, hydrofluoric acid, tetramethylammonium hydroxide, or combinations thereof to remove the second sacrificial material 428. The second sacrificial material 428 may be removed without substantially removing either of the first sacrificial material 426 or the first insulative material 430.

Removal of the second sacrificial material 428 may leave a portion of the first insulative material 430 extending above the first sacrificial material 426 by a step height $H_3$. In other words, the first insulative material 430 may be located more distal from the substrate 402 than the uppermost tier 410 by a distance corresponding to the step height $H_3$. The step height $H_3$ may correspond to a thickness at which the second sacrificial material 428 was initially formed.

Figure 4E:
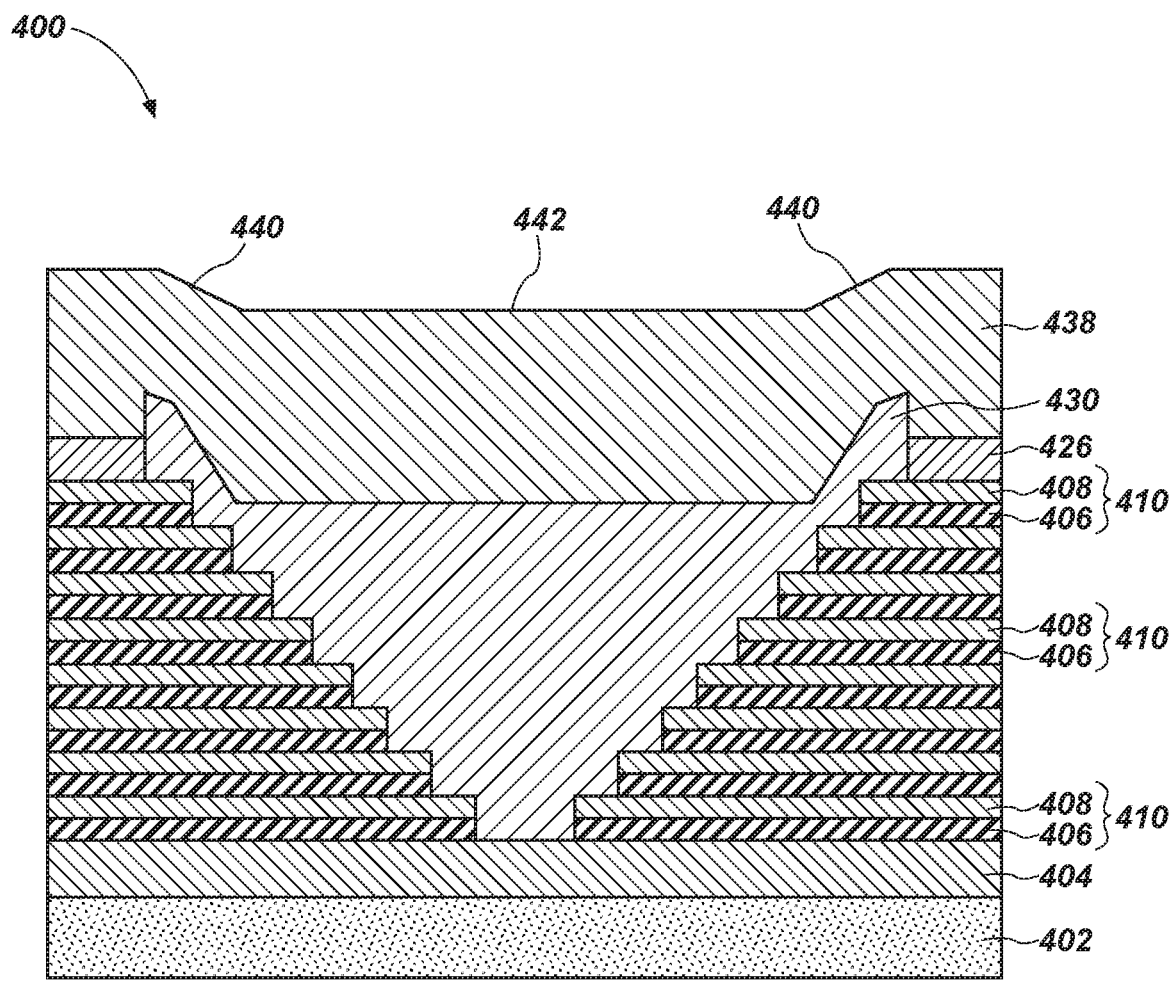

Referring to FIG. 4E, a second insulative material 438 may be formed over the first insulative material 430 and surfaces of the first sacrificial material 426. The second insulative material 438 may include a material formulated to exhibit an etch selectivity relative to the first sacrificial material 426. Accordingly, the second insulative material 438 may be formulated to be selectively removed from surfaces of the semiconductor structure 400 while the first sacrificial material 426 is not substantially removed.

In some embodiments, the second insulative material 438 may include the same material as the first insulative material 430. In other embodiments, the second insulative material 438 comprises a material that is different than the first insulative material 430. The second insulative material 438 may include a spin-on dielectric, TEOS, silicon dioxide, silicon nitride, phosphosilicate glass, borosilicate glass, fluorosilicate glass, another dielectric material, or combinations thereof. In some embodiments, the second insulative material 438 comprises TEOS. In other embodiments, the second insulative material 438 comprises a spin-on dielectric.

An exposed surface of the second insulative material 438 may include a laterally central surface 442 located directly above the valley 425 (FIG. 4A) and angled surfaces 440 located directly above the uppermost tiers 410 and laterally offset from the valley 425. The laterally central surface 442 may, in some embodiments, be substantially parallel to the major surface of the substrate 402. The angled surfaces 440 may be angled with respect to the laterally central surface 442 (and with respect to the major surface of the substrate 402). In some embodiments, the angle of the angled surfaces 440 may be less than the angle of the first angled surfaces 434 (FIG. 4D).

Figure 4F:
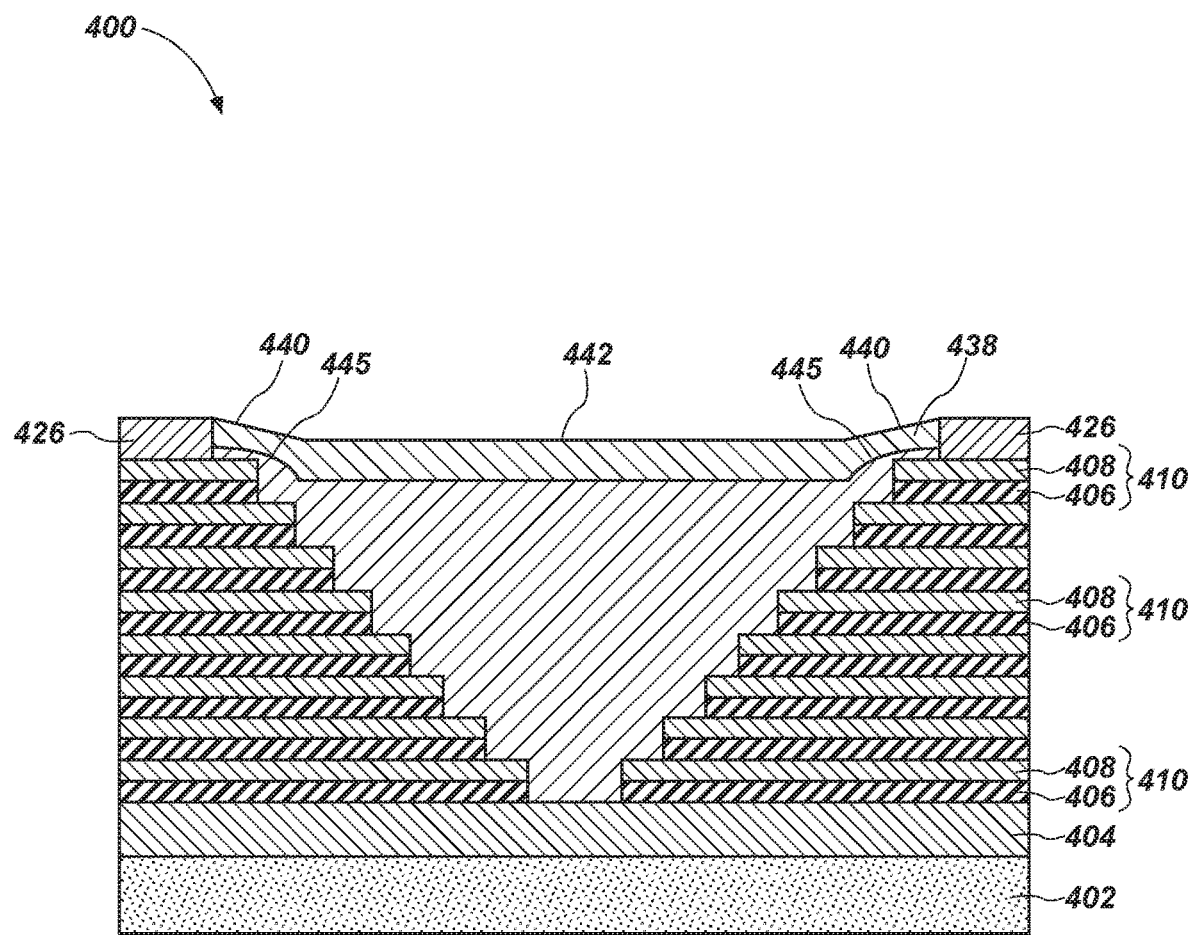

Referring to FIG. 4F, portions of the second insulative material 438 may be removed from surfaces of the first sacrificial material 426, to expose surfaces of the first sacrificial material 426. The second insulative material 438 may be exposed to a second material removal process, such as a second chemical mechanical planarization process, to remove portions of the second insulative material 438 while not removing portions of the first sacrificial material 426. The chemical mechanical planarization process may planarize a laterally central surface 442 of the second insulative material 438. In some embodiments, the chemical mechanical planarization process may be a so-called stop-on film chemical mechanical planarization process wherein the chemical mechanical planarization process stops after a surface of the first sacrificial material 426 is exposed.

The second chemical mechanical planarization process may be different from the first chemical mechanical planarization used to remove and planarize portions of the first insulative material 430 described above with reference to FIG. 4C. For example, while the first chemical mechanical planarization process is configured to planarize the first insulative material 430 and stop on the second sacrificial material 428 without substantially removing second sacrificial material 428, the second material removal process may be configured to planarize the second insulative material 438 and stop on the first sacrificial material 426 without substantially removing the first sacrificial material 426. In other words, the second chemical mechanical planarization process may be configured to exhibit a selectivity between the second insulative material 438 and the first sacrificial material 426. Stated another way, the second chemical mechanical planarization process may remove portions of the second insulative material 438 while not substantially removing portions of the first sacrificial material 426.

In some embodiments, exposing semiconductor structure 400 to the second chemical mechanical planarization process may form curved surfaces 445 between the first insulative material 430 and the second insulative material 438 at regions over the uppermost tier 410 and laterally offset from the valley 425 (FIG. 4A).

Figure 4G:
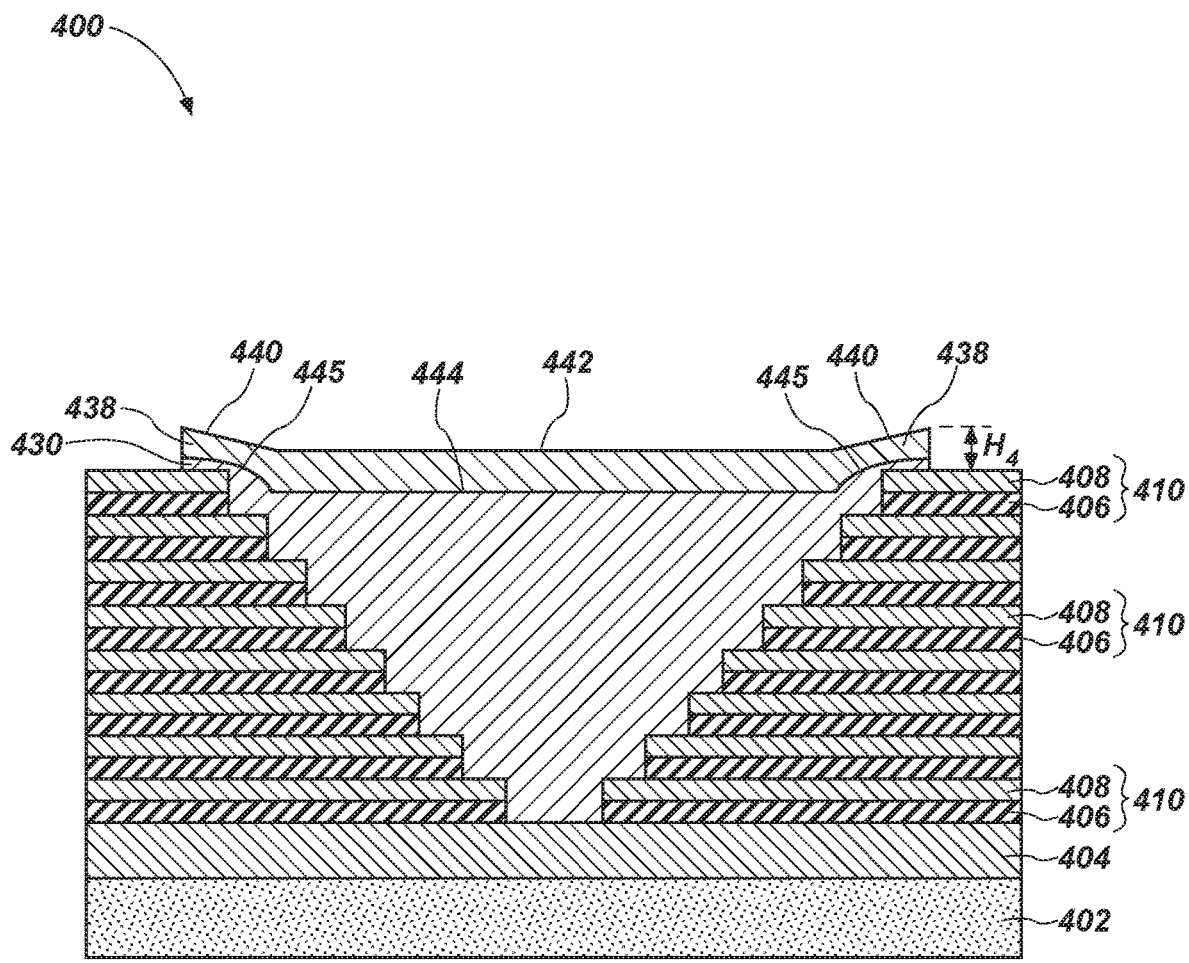

Referring to FIG. 4G, the first sacrificial material 426 (FIG. 4F) may be removed from surfaces of the uppermost tier 410. The first sacrificial material 426 may be removed by, for example, a dry etch process or a wet stripping process. In some embodiments, the first sacrificial material 426 is exposed to a dry etch gas comprising HBr, helium, and oxygen to remove the first sacrificial material 426. In other embodiments, the first sacrificial material 426 may be removed by exposing the first sacrificial material 426 to a wet etchant. The wet etchant may include nitric acid, hydrofluoric acid, tetramethylammonium hydroxide, or combinations thereof. In some embodiments, the material to remove the first sacrificial material 426 may be different than the material used to remove the second sacrificial material 428 as described above with reference to FIG. 4D.

A portion of the first insulative material 430 and the second insulative material 438 may extend over the uppermost tier 410 after removal of the first sacrificial material 426 by a step height H4. Accordingly, the first insulative material 430 and the second insulative material 438 may include portions that are more distal from the substrate 402 than the uppermost tier 410. Such portions may be laterally offset from the valley 425 (FIG. 4A). The step height $H_4$ of the first insulative material 430 and the second insulative material 438 over a surface of the uppermost tier 410 may correspond to a thickness at which the first sacrificial material 426 was initially formed. In some embodiments, the step height $H_4$ may be between about 300 Å and about 3,000 Å

In some embodiments, the angled surfaces 440 of the second insulative material 438 may be oriented at an angle between about 5° and about 45°, such as between about 5° and about 10°, between about 10° and about 15°, between about 15° and about 20°, between about 20° and about 30°, or between about 30° and about 45° with respect to the laterally central surface 442. Stated another way, the angled surfaces 440 may intersect the laterally central surface 442 at an angle.

An interface 444 between the first insulative material 430 and the second insulative material 438 may exhibit different material properties (e.g., crystal structure, dielectric properties, etc.), than either of the first insulative material 430 and the second insulative material 438. It is contemplated that, at least in some embodiments, the interface 444 may be indicative that the first insulative material 430 and the second insulative material 438 were formed (e.g., deposited) during different acts.

After forming and planarizing the first insulative material 430 and the second insulative material 438, holes may be formed through the first insulative material 430 and the second insulative material 438 and filled with a conductive material. The conductive material may form an electrical connection to an access line of the tiers 410 (e.g., to a contact area of the another material 408). In embodiments where the another material 408 comprises a nitride material, the nitride material may be removed and replaced with a conductive material (e.g., a conductive gate material) in a gate replacement process.

After removing the first sacrificial material 426, a nitride material or another insulative material may be formed over the semiconductor structure 400. In some embodiments, the nitride material may exhibit a similar profile as the first insulative material 430 and the second insulative material 438. For example, the nitride material may include a recessed portion at locations directly above the valley 425 (FIG. 4A) between one or more regions of the stair step structure 420 (FIG. 4A) and may include portions extending further from the substrate 402 than the recessed portions.

Although FIG. 4A through FIG. 4G have been described as including forming the semiconductor structure 400 with the first sacrificial material 426 and the second sacrificial material 428, the disclosure is not so limited. In other embodiments, such as where the valley 425 (FIG. 4A) has a depth greater than a predetermined distance (e.g., greater than about 6 μm, greater than about 10 μm, etc.), the method may include forming more than two sacrificial materials over the stair step structure (i.e., over the uppermost tier 410). By way of nonlimiting example, in some embodiments, a second sacrificial material may be formed over a first sacrificial material and at least a third sacrificial material may be formed over the second sacrificial material. The third sacrificial material may exhibit an etch selectivity relative to the second sacrificial material. In some embodiments, the third sacrificial material may comprise a same material as the first sacrificial material and may be separated from the first sacrificial material by the second sacrificial material. In addition, the third insulative material may comprise the same material as the first insulative material. After forming a first insulative material in a valley between one or more regions of the stair step structure, a chemical mechanical planarization process may remove portions of the first insulative material until surfaces of the third sacrificial material is exposed. The third sacrificial material may not be substantially removed during the chemical mechanical planarization of the first insulative material. The third sacrificial material may be removed to expose the second sacrificial material and a second insulative material may be formed over the first insulative material and surfaces of the second sacrificial material. Portions of the second insulative material may be removed with a chemical mechanical planarization process without substantially removing the second sacrificial material. In other words, the second sacrificial material may exhibit a selectivity with respect to the second insulative material. After removing portions of the second insulative material, the second sacrificial material may be removed and a third insulative material may be formed over the second insulative material and the first sacrificial material. Portions of the third insulative material may be removed and surfaces of the first sacrificial material may be exposed. The third insulative material may exhibit a selectivity with respect to the first sacrificial material and removal of portions of the third insulative material may not substantially remove the first sacrificial material. After patterning the third insulative material, the first sacrificial material may be removed, leaving at least the third insulative material extending over the uppermost tier by a step height.

Accordingly, any number of sacrificial materials and insulative materials may be used to form the semiconductor structure, depending on a depth of the valley between one or more facing regions of the stair step structure. In some embodiments, alternating sacrificial materials may be used such that sacrificial material directly adjacent to (e.g., directly above and directly below) other sacrificial materials exhibit a different selectivity than each other with respect to a material removal process (e.g., a slurry used during chemical mechanical planarization of insulative materials). Accordingly a first, a third, a fifth, etc., sacrificial material may exhibit a different selectivity than a second, a fourth, a sixth, etc., sacrificial material.

In some embodiments, for every between about 3 μm and about 8 μm of depth of the valley, an additional sacrificial material may be used to form the semiconductor structure. In some embodiments, the methods described above may be suitable for filling regions between a stair step structure having a depth of at least about 5 μm, at least about 10 μm, at least about 15 μm, at least about 20 μm, or at least about 30 μm. However, the disclosure is not so limited and greater depths may be filled according to the methods described herein.

Although FIG. 4A through FIG. 4G have not been described or illustrated as including a plurality of decks (e.g., the first deck 301 and the second deck 303, as described above with reference to FIG. 3A), in other embodiments, the semiconductor structure 400 may include more than a single deck of alternating levels of the dielectric material 406 and the another material 408.

Although FIG. 4A through FIG. 4G have been described as forming the stair step structure 420 before forming the first sacrificial material 426 and the second sacrificial material 428, the disclosure is not so limited. In other embodiments, the first sacrificial material 426 and the second sacrificial material 428 are formed over the tiers 410 of the alternating regions of the dielectric material 406 and the another material 408 prior to forming the stair step structure 420 defining the valley 425 between the one or more regions of the stair step structure 420. In some such embodiments, the stair step structure 420 may be formed after forming the first sacrificial material 426 and the second sacrificial material 428 over the tiers 410.

Forming the semiconductor structure 400 according to the methods described herein may reduce a number of chemical mechanical planarization acts to form the semiconductor structure 400 compared to conventional methods. In addition, the method may be scaled to semiconductor structures including a valley 425 (FIG. 4A) or a gap having a depth greater than those described above. Because the semiconductor structures are formed with the sacrificial materials described above, even though the semiconductor structures may include insulative materials having a depth greater than a predetermined amount, the insulative materials may not include a substantial step height over an uppermost tier of the stair step structure. Further, the semiconductor structures formed according to the methods described herein may exhibit a reduced fail rate (such as by insufficient electrical contact to a conductive word line (e.g., the another material 408)) of the uppermost tier.

Accordingly, in some embodiments, a method of forming a semiconductor structure comprises filling a valley region defined by a stair step structure comprising alternating levels of a dielectric material and another material with a first insulative material, planarizing the first insulative material and exposing surfaces of a second sacrificial material over an uppermost level of the stair step structure, removing the second sacrificial material to expose a first sacrificial material underlying the second sacrificial material, forming a second insulative material over surfaces of the first insulative material and the first sacrificial material, planarizing the second insulative material and exposing surfaces of the first sacrificial material, and removing the first sacrificial material from the semiconductor structure.

Accordingly, in some embodiments, a semiconductor device comprises a stair step structure comprising tiers of alternating levels of a dielectric material and another material ascending in a direction away from a substrate, and an insulative material filling a region between steps of the stair step structure, the insulative material extending from a portion of the stair step structure proximate the substrate to a location beyond an uppermost tier of the alternating levels, the insulative material comprising a first portion overlying the uppermost tier and located further from the substrate than the uppermost tier, and a second portion directly above the region located closer to the substrate than the first portion.

While the non-volatile memory devices described herein may make specific reference to NAND Flash memory devices, the disclosure is not so limited and may be applied to other semiconductor memory devices. By way of non-limiting example, the semiconductor structures may not necessarily include a stair step structure, but may include regions having an insulative material extending in a trench or valley between other portions of the semiconductor device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
   stair step structures comprising steps opposing each other, the stair step structures each comprising alternating levels of a dielectric material and another material;
   a first liner material overlying the steps of the stair step structures and a region between the stair step structures;
   a second liner material overlying the first liner material and having a different material composition than the first liner material;
   an insulative material adjacent to the second liner material and between the stair step structures; and
   another insulative material adjacent to the insulative material, an interface between the insulative material and the another insulative material comprising an arcuate surface.

2. The device of claim 1, wherein the another material comprises a conductive material.

3. The device of claim 1, wherein the first liner comprises an oxide material.

4. The device of claim 3, wherein the second liner comprises silicon nitride.

5. The device of claim 1, wherein the first liner and the second liner extend a height above an uppermost level of the dielectric material and the another material.

6. The device of claim 5, wherein the height is between about 300 Å and about 3,000 Å.

7. A device, comprising:
   a first stair step structure comprising alternating tiers of a dielectric material and another material;
   a second stair step structure comprising alternating tiers of the dielectric material and the another material defining steps facing steps of the first stair step structure;
   a liner material over the steps of the first stair step structure and the steps of the second stair step structure;
   a first insulative material over the liner material and between the first stair step structure and the second stair step structure; and
   a second insulative material over the first insulative material between the first stair step structure and the second stair step structure and contacting an uppermost tier of the dielectric material and the another material of the first stair step structure and the second stair step structure, the liner material intervening between a portion of the first insulative material and a portion of the second insulative material.

8. The device of claim 7, wherein the first insulative material extends from a lowermost tier of the tiers of the dielectric material and the another material to above the uppermost tier of the tiers of the dielectric material and the another material.

9. The device of claim 7, wherein a thickness of the liner material is between about 25 Å and about 150 Å.

10. The device of claim 7, wherein the first insulative material comprises a spin-on dielectric material, silicon dioxide, silicon nitride, phosphosilicate glass, borosilicate glass, or fluorosilicate glass.

11. The device of claim 7, wherein the first insulative material extends above the uppermost tier of the alternating tiers of the dielectric material and the another material by a height between about 300 Å and about 3,000 Å.

12. The device of claim 7, wherein the second insulative material comprises silicon dioxide or silicon nitride.

13. The device of claim 7, further comprising another liner material located between the liner material and the first insulative material.

14. A stair step structure, comprising:
   a stack structure comprising tiers of a dielectric material and another material defining steps of the stair step structure;
   a first insulative material substantially filling a valley between opposing steps of the stair step structure;
   a second insulative material adjacent to the first insulative material, a portion of the second insulative material contacting an uppermost tier of the tiers of the dielectric material and the another material and another portion of the second insulative material contacting the first insulative material; and
   a first liner and a second liner between the steps of the stair step structure and the first insulative material, the first liner and the second liner intervening between a portion of the first insulative material and a portion of the second insulative material.

15. The stair step structure of claim 14, wherein the second insulative material extends beyond the valley between opposing steps of the stair step structure.

16. The stair step structure of claim 14, wherein the second insulative material surrounds an upper portion of the first insulative material.

17. The stair step structure of claim 14, wherein substantially all portions of the second insulative material are located above the uppermost tier of the tiers of the dielectric material and the another material.

* * * * *

UNITED STATES PATENT AND TRADEMARK OFFICE
CERTIFICATE OF CORRECTION

PATENT NO. : 11,088,017 B2
APPLICATION NO. : 16/806312
DATED : August 10, 2021
INVENTOR(S) : John B. Matovu et al.

Page 1 of 1

It is certified that error appears in the above-identified patent and that said Letters Patent is hereby corrected as shown below:

In the Specification

Column 16, Line 18, change "$H_4of$" to --$H_4$ of--

Signed and Sealed this
Seventh Day of September, 2021

Drew Hirshfeld
*Performing the Functions and Duties of the
Under Secretary of Commerce for Intellectual Property and
Director of the United States Patent and Trademark Office*